US012795835B2

(12) United States Patent
Meng et al.

(10) Patent No.: US 12,795,835 B2
(45) Date of Patent: Nov. 10, 2026

(54) SENSING DEVICE AND PREPARATION METHOD THEREFOR

(71) Applicants: Beijing BOE Technology Development Co., Ltd., Beijing (CN); BOE Technology Group Co., Ltd., Beijing (CN)

(72) Inventors: Fanli Meng, Beijing (CN); Shuo Zhang, Beijing (CN); Zeyuan Li, Beijing (CN); Tuo Sun, Beijing (CN); Hai Yu, Beijing (CN); Yanzhao Li, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 166 days.

(21) Appl. No.: 18/291,913

(22) PCT Filed: Aug. 10, 2022

(86) PCT No.: PCT/CN2022/111440

§ 371 (c)(1),
(2) Date: Jan. 24, 2024

(87) PCT Pub. No.: WO2023/020351

PCT Pub. Date: Feb. 23, 2023

(65) Prior Publication Data

US 2024/0365474 A1 Oct. 31, 2024

(30) Foreign Application Priority Data

Aug. 18, 2021 (CN) ......................... 202110950865.4

(51) Int. Cl.
*H05K 3/06* (2006.01)
*H01Q 1/38* (2006.01)
(Continued)

(52) U.S. Cl.
CPC ............... *H05K 3/064* (2013.01); *H01Q 1/38* (2013.01); *H05K 3/18* (2013.01); *H05K 3/182* (2013.01);
(Continued)

(58) Field of Classification Search
CPC .......... H05K 3/064; H05K 3/18; H05K 3/182; H05K 3/188; H05K 2201/10098; H05K 3/06; H01Q 1/38; C23F 1/18
See application file for complete search history.

(56) References Cited

U.S. PATENT DOCUMENTS

2014/0311778 A1 10/2014 Suzuki et al.
2015/0345042 A1* 12/2015 Yeh ........................ C25D 7/123 216/13

(Continued)

FOREIGN PATENT DOCUMENTS

CN 1889812 A 1/2007
CN 1963999 A 5/2007

(Continued)

OTHER PUBLICATIONS

CN 1113708554 A, Method for manufacturing antenna used in electronic apparatus, involves forming conductive layer on surface of photoresist layer away from transparent substrate and trench through electroplating process, English Language abstract (Year: 2020).*

(Continued)

*Primary Examiner* — Anita K Alanko

(57) ABSTRACT

A method for preparing a sensing device is provided, the method includes: forming, on a surface of a transparent substrate, a first auxiliary patterning layer having a trench; and forming a mesh structure in the trench of the first auxiliary patterning layer by means of an electroplating process, or forming a conductive layer in the trench of the
(Continued)

first auxiliary patterning layer by means of an electroplating process and then etching the conductive layer to form a mesh structure. The mesh structure has a line width of less than or equal to 1.5 microns and a thickness of greater than or equal to 2 microns.

17 Claims, 18 Drawing Sheets

(51) Int. Cl.
*H05K 3/18* (2006.01)
*C23F 1/18* (2006.01)

(52) U.S. Cl.
CPC ................ *H05K 3/188* (2013.01); *C23F 1/18* (2013.01); *H05K 2201/10098* (2013.01)

(56) References Cited

U.S. PATENT DOCUMENTS

| | | | | |
|---|---|---|---|---|
| 2016/0270242 | A1 | 9/2016 | Kim et al. | |
| 2016/0278205 | A1 | 9/2016 | Bae et al. | |
| 2017/0351352 | A1 | 12/2017 | Hsu | |
| 2018/0046283 | A1 | 2/2018 | Yoshida et al. | |
| 2022/0344203 | A1 * | 10/2022 | Ma ...................... | H10W 20/043 |

FOREIGN PATENT DOCUMENTS

| | | | | | |
|---|---|---|---|---|---|
| CN | 102595798 | A | | 7/2012 | |
| CN | 104120427 | A | | 10/2014 | |
| CN | 104350551 | A | | 2/2015 | |
| CN | 107479230 | A | | 12/2017 | |
| CN | 108847407 | A | | 11/2018 | |
| CN | 109922645 | A | | 6/2019 | |
| CN | 110473655 | A | | 11/2019 | |
| CN | 111355026 | A | | 6/2020 | |
| CN | 111370854 | A | * | 7/2020 | ............. C23C 14/24 |
| CN | 112259465 | A | | 1/2021 | |
| TW | 201545215 | A | | 12/2015 | |
| WO | WO-2022193099 | A1 | * | 9/2022 | ............ H10P 50/287 |

OTHER PUBLICATIONS

WO 2022/193099 A1, Manufacturing method for metal grid, thin film sensor and manufacturing method therefor, English language machine translation, (Year: 2022).*

Office Action dated Dec. 3, 2025 for CN 202110950865.4 and English Translation.

International Search Report for PCT/CN2022/111440 Mailed Nov. 9, 2022.

* cited by examiner

SENSING DEVICE AND PREPARATION METHOD THEREFOR

CROSS-REFERENCE TO RELATED APPLICATIONS

The present application is a U.S. National Phase Entry of International Application No. PCT/CN2022/111440 having an international filing date of Aug. 10, 2022, which claims priority to Chinese Patent Application No. 202110950865.4 filed to the CNIPA on Aug. 18, 2021 and entitled "Sensing Device and Preparation Method Therefor". The above-identified applications are hereby incorporated by reference.

TECHNICAL FIELD

The present disclosure relates to, but is not limited to, the field of display technologies, and particularly to a sensing device and a preparation method therefor.

BACKGROUND

With the development of wireless communication technology, mobile communication products have developed rapidly. Mobile communication products may implement a function of data transmission and achieve a purpose of resource sharing. In mobile communication products, an antenna is one of the necessary components. Herein, Antenna on Display (AoD) technology (that is, arranging a transparent antenna on the display screen) is an important development direction.

SUMMARY

The following is a summary of subject matter described herein in detail. The summary is not intended to limit the scope of protection of the claims.

An embodiment of the present disclosure provides a sensing device and a preparation method thereof.

In one aspect, an embodiment of the present disclosure provides a preparation method for a sensing device, including: forming a first auxiliary patterning layer having a groove on a surface of a transparent substrate; forming a mesh structure in the groove of the first auxiliary patterning layer through an electroplating process, or forming a conductive layer in the groove of the first auxiliary patterning layer through an electroplating process, and etching the conductive layer to form the mesh structure. Herein, a wire width of the mesh structure is less than or equal to 1.5 microns, and a thickness of the mesh structure is greater than or equal to 2 microns.

In some exemplary implementations, the etching of the conductive layer includes etching the conductive layer by using a wet etching process.

In some exemplary implementations, the forming of a first auxiliary patterning layer having a groove on a surface of a transparent substrate includes: coating a photoresist material on the surface of the transparent substrate, exposing and developing the photoresist material to form the first auxiliary patterning layer having a groove; wherein a width of the groove is larger than a wire width of the mesh structure. After forming the conductive layer and before etching the conductive layer, the method further includes removing the first auxiliary patterning layer.

In some exemplary implementations, before the forming of the first auxiliary patterning layer having a groove on the surface of the transparent substrate, the method further includes forming a seed layer on the surface of the transparent substrate through a deposition process; and after the first auxiliary patterning layer is formed, the groove of the first auxiliary patterning layer exposes a surface of the seed layer. After removing the first auxiliary patterning layer and before etching the conductive layer, the method further includes etching the seed layer to remove the seed layer not covered by the conductive layer.

In some exemplary implementations, before forming the seed layer on the surface of the transparent substrate through a deposition process, the method further includes forming an adhesive layer on the surface of the transparent substrate through a deposition process. After etching the conductive layer, the method further includes: etching the adhesive layer and retaining the adhesive layer covered by the etched conductive layer.

In some exemplary implementations, after forming the first auxiliary patterning layer having a groove on the surface of the transparent substrate, and before forming a conductive layer in the groove of the first auxiliary patterning layer through an electroplating process, the method further includes forming a seed layer in the groove and on the surface of the first auxiliary patterning layer away from the transparent substrate through a deposition process.

In some exemplary implementations, the forming of the conductive layer in the groove of the first auxiliary patterning layer through an electroplating process includes: forming a first electroplated layer and a second electroplated layer in the groove and on a surface of the first auxiliary patterning layer away from the transparent substrate through an electroplating process; and removing the second electroplated layer, the first electroplated layer, and the seed layer of the surface of the first auxiliary patterning layer away from the transparent substrate to form a conductive layer in the groove of the first auxiliary patterning layer.

In some exemplary implementations, the forming of the conductive layer in the groove of the first auxiliary patterning layer through an electroplating process includes forming a first electroplated layer in the groove and on a surface of the first auxiliary patterning layer away from the transparent substrate through an electroplating process; removing the seed layer and the first electroplated layer of the surface of the first auxiliary patterning layer away from the transparent substrate, and retaining the seed layer and the first electroplated layer in the groove; and forming a second electroplated layer in the groove of the first auxiliary patterning layer through an electroplating process.

In some exemplary implementations, before forming the first auxiliary patterning layer having a groove on the surface of the transparent substrate, the method further includes sequentially forming a second auxiliary patterning thin film, a hard mask, and a patterned first photoresist layer on the surface of the transparent substrate; etching the second auxiliary patterning thin film and the hard mask by using the patterned first photoresist layer to form a patterned second auxiliary patterning layer. The forming of the first auxiliary patterning layer having a groove on the surface of the transparent substrate includes: forming a first auxiliary patterning layer on a surface of the second auxiliary patterning layer away from the transparent substrate, wherein a surface of the first auxiliary patterning layer away from the transparent substrate is flush with the surface of the second auxiliary patterning layer away from the transparent substrate; removing the second auxiliary patterning layer to form the groove of the first auxiliary patterning layer, wherein a width of the groove is substantially the same as the wire width of the mesh structure.

In some exemplary implementations, the first auxiliary patterning layer is made of a photoresist material. Before forming the second auxiliary patterning thin film on the surface of the transparent substrate, the method further includes forming a seed layer on the surface of the transparent substrate. After forming the mesh structure in the groove of the first auxiliary patterning layer through an electroplating process, the method further includes: removing the first auxiliary patterning layer, etching the seed layer, and removing the seed layer not covered by the mesh structure.

In some exemplary implementations, the first auxiliary patterning layer is made of a photosensitive resin material. Before forming the second auxiliary patterning thin film on the surface of the transparent substrate, the method further includes forming a seed layer on the surface of the transparent substrate. After etching the second auxiliary patterning thin film and the hard mask by using the patterned first photoresist layer to form the patterned second auxiliary patterning layer, the method further includes etching the seed layer to remove the seed layer not covered by the second auxiliary patterning layer.

In some exemplary implementations, the etching of the conductive layer to form the mesh structure includes forming a patterned second photoresist layer on surfaces of the first auxiliary patterning layer and the conductive layer away from the transparent substrate, wherein the second photoresist layer exposes the conductive layer at a target position; removing the conductive layer at the target position through an etching process to form the mesh structure.

In some exemplary implementations, the first auxiliary patterning layer is made of a photosensitive resin material. After forming the first auxiliary patterning layer having a groove on the surface of the transparent substrate, and before forming the mesh structure in the groove of the first auxiliary patterning layer through an electroplating process, the method further includes forming a seed layer in the groove and on the surface of the first auxiliary patterning layer away from the transparent substrate through a deposition process. The forming of the mesh structure in the groove of the first auxiliary patterning layer through an electroplating process includes: forming a first electroplated layer and a second electroplated layer in the groove and on the surface of the first auxiliary patterning layer away from the transparent substrate through an electroplating process; and removing the second electroplated layer, the first electroplated layer, and the seed layer of the surface of the first auxiliary patterning layer away from the transparent substrate to form an antenna structure in the groove of the first auxiliary patterning layer.

In some exemplary implementations, the transparent substrate has a valid region, and an invalid region surrounding the valid region. The mesh structure is located in the valid region, and the invalid region is provided with an invalid mesh; and a wire width of the invalid mesh is greater than or equal to a wire width of the mesh structure of the valid region.

In some exemplary implementations, the transparent substrate further has an energized region surrounding the invalid region, and the energized region is configured to provide an electroplating current in an electroplating process.

In some exemplary implementations, the valid region includes an antenna region and a visual compensation region located on at least one side of the antenna region; and a pattern of a mesh structure of the antenna region is different from a pattern of a mesh structure of the visual compensation region.

In some exemplary implementations, the wire width of the invalid mesh is increased gradually and continuously or step by step, along a direction away from the valid region.

In some exemplary implementations, a thickness of the mesh structure is about 2 micron to 5 microns.

On the other hand, an embodiment of the present disclosure provides a sensing device, which is prepared by using the method described above.

In some exemplary implementations, the sensing device is a transparent antenna.

After the drawings and the detailed descriptions are read and understood, the other aspects may be comprehended.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
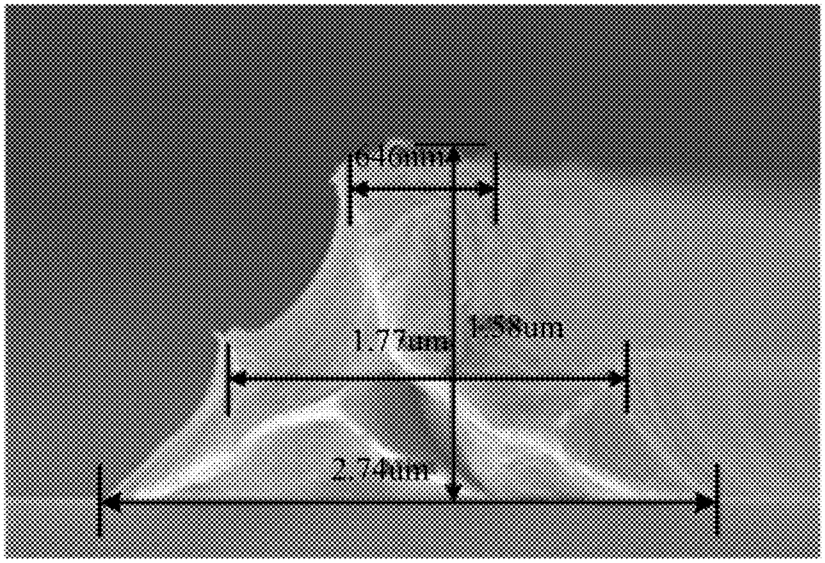
FIG. 1 is a cross-sectional topography of metal wires obtained through a two-step photoetching process.

The embodiments of the present disclosure will be described below with reference to the drawings in detail. Implementations may be practiced in multiple different forms. Those of ordinary skills in the art may easily understand such a fact that implementations and contents may be transformed into other forms without departing from the purpose and scope of the present disclosure. Therefore, the present disclosure should not be explained as being limited to the contents recorded in the following implementations only. The embodiments and features in the embodiments of the present disclosure may be randomly combined with each other in case of no conflicts.

In the drawings, a size of one or more constituent elements, a thickness of a layer, or a region is sometimes exaggerated for clarity. Therefore, one implementation of the present disclosure is not necessarily limited to the size, and a shape and a size of one or more components in the drawings do not reflect an actual scale. In addition, the accompanying drawings schematically illustrate ideal examples, and a mode of the present disclosure is not limited to the shapes, numerical values, or the like shown in the drawings.

Ordinal numerals "first", "second", "third", etc., in the specification are set not to form limits in number but only to avoid the confusion of composition elements. In the present disclosure, "a plurality/multiple" represents two or more than two.

In the specification, for convenience, expressions "central", "above", "below", "front", "back", "vertical", "horizontal", "top", "bottom", "inside", "outside", etc., indicating orientation or positional relationships are used to illustrate positional relationships between the composition elements with reference to the drawings, not to indicate or imply that involved devices or elements are required to have specific orientations and be structured and operated with the specific orientations but only to easily and simply describe the present specification, and thus should not be understood as limits to the present disclosure. The positional relationships between the constituent elements can be changed as appropriate according to a direction where the constituent elements are described. Therefore, appropriate replacements based on situations are allowed, not limited to the expressions in the specification.

In the specification, unless otherwise specified and defined, terms "mounting", "mutual connection", and "connection" should be generally understood. For example, a connection may be a fixed connection, a detachable connection, or an integrated connection; it may be a mechanical connection or a connection; it may be a direct connection, an indirect connection through a middleware, or an internal communication inside between two components. Those of ordinary skills in the art may understand meanings of the above-mentioned terms in the present disclosure according to situations.

In the specification, "electric connection" includes connection of the composition elements through an element with a certain electric action. The "element with the certain electrical effect" is not particularly limited as long as electrical signals between the connected constituent elements may be transmitted. Examples of the "element having some electrical function" not only include an electrode and a wiring, but also include a switch element such as a transistor, a resistor, an inductor, a capacitor, other elements with a plurality of functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In this specification, the deposition process may be any one or more of sputtering, evaporation and Chemical Vapor Deposition (CVD), the coating may be any one or more of spray coating, spin coating and blade coating, and the etching process may be any one or more of dry etching and wet etching. A "thin film" refers to a layer of a thin film prepared from a material on a base substrate using a process of deposition or coating.

In this specification, the complete steps of the electroplating process may include: pre-cleaning, spraying with deionized water, immersing in an electroplating liquid, electroplating with a first current, electroplating with a second current, and rinsing with deionized water, wherein the first current is less than the second current. The surface electroplating process is based on a whole surface of a seed layer. The wire electroplating process is electroplating based on a patterned seed layer (e.g. a seed layer with a mesh pattern). The complete steps of the wet etching process may include: pre-cleaning, wetting with deionized water, etching with etching solution, rinsing with deionized water, and air-drying with Clean Dry Air (CDA). Herein, the etching with the etching solution may adopt immersing or spraying mode.

In the present disclosure, "thickness" may be a dimension of a film layer in a direction perpendicular to a substrate. "Width" may be a dimension along a direction perpendicular to an extension direction. "Wire width" may be a dimension of wires in a direction perpendicular to an extension direction.

In the present disclosure, "about" and "substantially" refer to that a boundary is not defined strictly and a case within a range of process and measurement errors is allowed. In the present disclosure, "substantially the same" may be referred to a case where values differ by less than 10%.

In some implementations, transparent conductive materials, (such as Indium Tin Oxide (ITO)), or multi-layer film materials of metal and conductive oxide, or metal mesh films, are commonly used to achieve a transparent sensing device (such as a transparent antenna) design. Taking the transparent antenna being prepared by ITO as an example, although ITO has a certain conductivity, compared with metal materials, the resistance of ITO is difficult to meet the radiation energy efficiency requirements of antennas applied in 5G frequency band. Although the resistivity of metal materials is low, due to the non-transparent nature of metal materials, the wire width of metal wires needs to ensure visual transparency at normal viewing distance, so as to be used in transparent antennas. Moreover, the thickness of the metal wire should ensure that the resistivity meets the requirements of antenna radiation energy efficiency. However, the metal wires preparation process in the current transistor backplane process based on the glass substrate cannot meet the technological requirements of transparent antennas.

In some implementations, a two-step lithography may be used to prepare the metal wires of the metal mesh. For example, the two-step lithography may include the following processes: (a) sputtering and depositing a metal layer with a thickness of about 7000 angstroms on a transparent substrate; (b) coating photoresist and forming a patterned photoresist layer through exposure and development; (c) etching the metal layer exposed by the photoresist layer through a wet etching process to form a metal wire; and repeating the steps (a) to (c) above. Taking that a design wire width of the mask plate used for exposure is 1.5 microns (um) as an example, a cross-sectional morphology of a metal wire obtained by the two-step lithography is shown in FIG. 1. Herein, the cross section of the metal wire is a regular triangle, and along a direction away from the transparent substrate, the widths of the metal wire are respectively 2.74 um, 1.77 um and 640 nm; and a thickness of the metal wire is about 1.58 um. Although the design wire width of the mask plate is 1.5 um, the final wire width of the metal wire is larger than the design wire width of 1.5 um since the exposure of the mask to the photoresist cannot produce a mask pattern with a wire width of 1.5 um.

Figure 2:
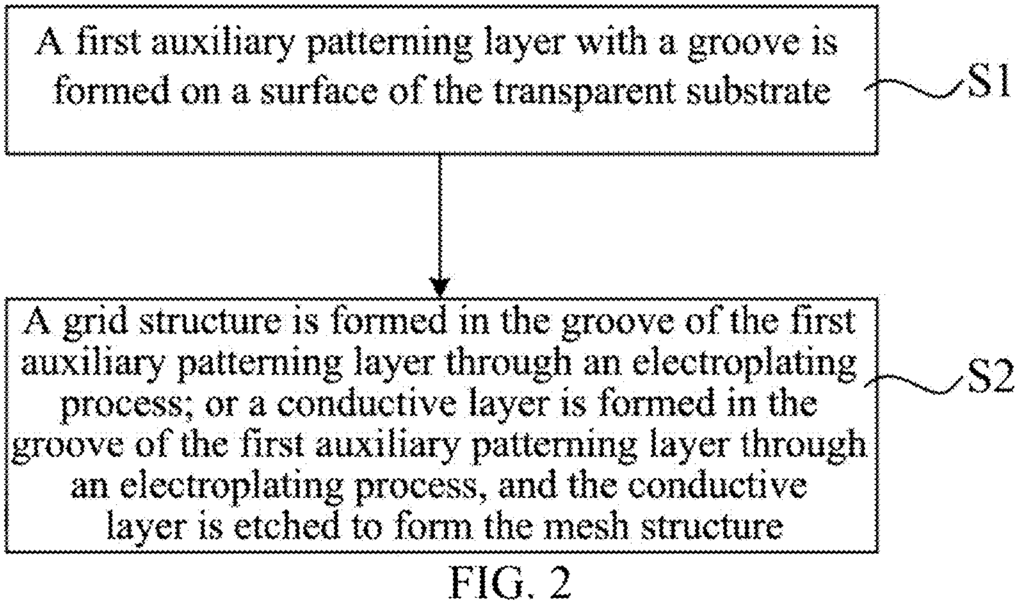
FIG. 2 is a flowchart of a preparation method for a sensing device according to at least one embodiment of the present disclosure.

FIG. 2 is a flowchart of a preparation method for a sensing device according to at least one embodiment of the present disclosure. As shown in FIG. 2, a preparation method for a sensing device according to the embodiment of the present disclosure includes the following steps.

At S1, a first auxiliary patterning layer with a groove is formed on a surface of the transparent substrate;

at S2, a mesh structure is formed in the groove of the first auxiliary patterning layer through an electroplating process; or a conductive layer is formed in the groove of the first auxiliary patterning layer through an electroplating process, and the conductive layer is etched to form the mesh structure. Herein, a wire width of the mesh structure is less than or equal to 1.5 um, and a thickness of the mesh structure is greater than or equal to 2 um.

The preparation method for a sensing device according to the present embodiment utilizes the groove of the first auxiliary patterning layer, and combines an electroplating process, or combines an electroplating process and an etching process to form the mesh structure with a wire width and a thickness meeting the conditions, so as to prepare a sensing device. In some examples, taking a sensing device obtained by the preparation method of the present embodiment is a transparent antenna as an example, and the transparent antenna obtained by the preparation method of the present embodiment has better light transmittance and can meet the requirements of microwave circuit characteristics. For example, the transparent antenna prepared by the present embodiment may be arranged on a surface of a display screen, thereby effectively improving the transmitting and receiving performance for wireless signals. However, this embodiment is not limited thereto. In some examples, other types of sensing devices having a mesh structure may be obtained by the preparation method of the sensing device of the present embodiment.

In some exemplary implementations, the wire width of the mesh structure may be about 1 um or 1.5 um. The thickness of the mesh structure may be about 2 um to 5 um, for example, about 3 um, 4 um, or 5 um. However, this embodiment is not limited thereto. In some examples, a dimension of the mesh structure of the sensing device prepared by the present embodiment may only need to meet the required characteristic requirements of the sensing device. For example, the dimension of the mesh structure of the transparent antenna prepared in the present embodiment only needs to meet the requirements of light transmittance and microwave circuit characteristics of the transparent antenna.

In some exemplary implementations, etching a conductive layer may include etching the conductive layer by using a wet etching process. In some examples, a wet etching process may be used to etch the conductive layer one or more times to narrow the wire width to obtain a mesh structure that meets the wire width and thickness conditions. However, this embodiment is not limited thereto.

In some exemplary implementations, the groove of the first auxiliary patterning layer is mesh-like, and the shapes and dimensions of the groove and mesh structure are substantially the same. A width of the groove of the first auxiliary patterning layer may be substantially the same as the wire width of the mesh structure. In this example, the mesh structure may be formed directly in the groove of the first auxiliary patterning layer through an electroplating process. Through a groove preparation process combined with an electroplating process, a mesh structure with a dimension meeting the requirements may be obtained.

In some exemplary implementations, the groove of the first auxiliary patterning layer may be mesh-like and the shape of the groove may be substantially the same as the shape of the mesh structure. The width of the groove of the first auxiliary patterning layer is larger than the wire width of the mesh structure. In this example, after the conductive layer is formed in the groove through an electroplating process, the wire width is narrowed by etching the conductive layer to obtain a mesh structure. By combining an electroplating process with an etching process (e.g. a wet etching process), a mesh structure with a dimension meeting the requirements may be obtained.

In some exemplary implementations, a seed layer may be formed before the first auxiliary patterning layer is formed, or may be formed after a groove of the first auxiliary patterning layer is formed to facilitate subsequent use of the seed layer in an electroplating process. However, this embodiment is not limited thereto.

In some exemplary implementations, the first auxiliary patterning layer may be made of a photoresist material (e.g. photoresist), or may be made of a photosensitive resin material (e.g. optical adhesive). In some examples, the first auxiliary patterning layer may be made of a photoresist material, and after a groove is formed in the first auxiliary patterning layer, the second auxiliary patterning layer is utilized to directly form a mesh structure in the groove of the first auxiliary patterning layer; or after a groove is formed in the first auxiliary patterning layer through a photolithography process, a conductive layer is formed in the groove of the first auxiliary patterning layer, and the conductive layer is etched after the first auxiliary patterning layer is removed to narrow the wire width to form a mesh structure. In some examples, the first auxiliary patterning layer may be made of a photosensitive resin material, the second auxiliary patterning layer is utilized to directly form a mesh structure in the groove of the first auxiliary patterning layer after a groove is formed in the first auxiliary patterning layer, and the first auxiliary patterning layer may be retained as an optical over coat layer. However, this embodiment is not limited thereto.

In some exemplary implementations, before forming the first auxiliary patterning layer having a groove on the surface of the transparent substrate, the preparation method for the antenna may further include: sequentially forming a second auxiliary patterning thin film, a hard mask, and a patterned first photoresist layer on the surface of the transparent substrate; etching the second auxiliary patterning thin film and the hard mask by using the patterned first photoresist layer to form a patterned second auxiliary patterning layer. In this example, forming the first auxiliary patterning layer having a groove on the surface of the transparent substrate may include: forming a first auxiliary patterning layer on a surface of the second auxiliary patterning layer away from the transparent substrate, wherein a surface of the first auxiliary patterning layer away from the transparent substrate is flush with the surface of the second auxiliary patterning layer away from the transparent substrate; removing the second auxiliary patterning layer to form the groove of the first auxiliary patterning layer. In the present exemplary implementation, based on a principle of pattern complementarity, the second auxiliary patterning layer is utilized to form a groove which has substantially the same shape and dimension as the mesh structure, forming the mesh structure in the groove.

In some exemplary implementations, the transparent substrate may have a valid region, and an invalid region surrounding the valid region. The mesh structure is located in the valid region, and the invalid region is provided with an invalid mesh. A wire width of the invalid mesh may be greater than or equal to a wire width of the mesh structure of the valid region. In some examples, the wire width of the invalid mesh may be increased gradually and continuously along a direction away from the valid region, or increased step by step. However, this embodiment is not limited thereto.

In some exemplary implementations, the transparent substrate has an energized region surrounding the invalid region. The energized region is configured to provide an electroplating current in the electroplating process. In some examples, in the preparation process of the sensing device of this example, after a preparation of a film layer of the sensing device is completed, the invalid region and the energized region are cut off to obtain the sensing device.

Solutions of this embodiment will be described below through multiple examples. In the following example, it is illustrated by taking that the prepared sensing device is a transparent antenna as an example. However, this embodiment is not limited thereto. In some examples, other types of sensing devices having a mesh structure may be obtained by using the preparation method of the sensing device according to the present embodiment.

In some exemplary implementations, the transparent antenna may be prepared first by preparing an antenna substrate and then cutting the antenna substrate to obtain one or more transparent antennas. Herein, the transparent antenna can be bound to a microwave signal control circuit and electrically connected to a motherboard of an electronic device (e.g. a mobile phone) through the microwave signal control circuit. For example, the microwave signal control circuit may be a Printed Circuit Board (PCB) or a Flexible Printed Circuit Board (FPC). The transparent antenna may be provided on a surface of an electronic device (e.g. a display screen) to enable the transmitting and receiving of radio signals (e.g. microwave signals). For example, the transparent antenna may be attached on a touch layer of the display screen and below a glass cover plate. However, this embodiment is not limited thereto.

Figure 3:
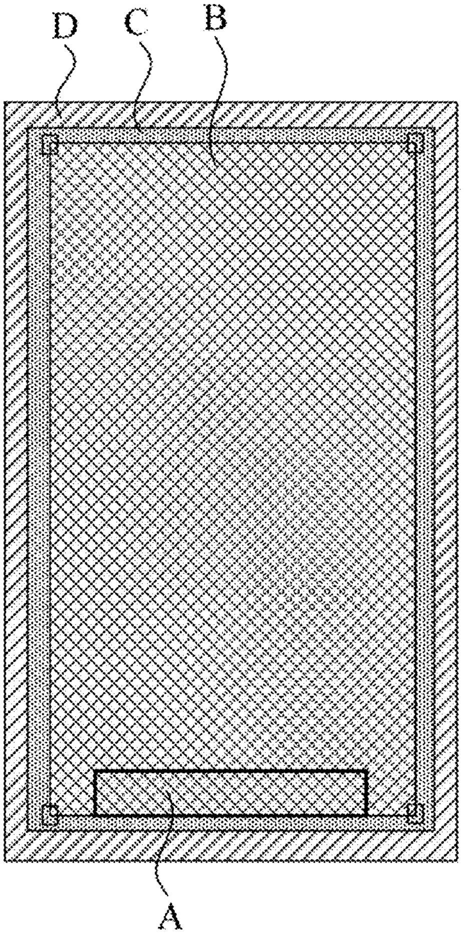
FIG. 3 is a plan schematic diagram of an antenna substrate according to at least one embodiment of the present disclosure.

FIG. 3 is a schematic diagram of an antenna substrate according to at least one embodiment of the present disclosure. As shown in FIG. 3, it is illustrated by taking that the antenna substrate includes one valid region as an example. One valid region corresponds to one transparent antenna. However, this embodiment is not limited thereto. In some examples, the antenna substrate may include a plurality of valid regions arranged periodically and regularly, and subsequent cutting for the antenna substrate may make the antenna substrate be divided into a plurality of transparent antennas.

In some exemplary implementations, as shown in FIG. 3, the antenna substrate includes a valid region, an invalid region C and an energized region D. The invalid region C surrounds an outer side of the valid region, and an energized region D surrounds an outer side of the invalid region C. As a buffer region between the energized region D and the valid region, the invalid region C can isolate the energized region D and the valid region and play a process buffer role. The energized region D is a region implementing an electrical connection between the seed layer and a power supply of an electroplating device in the electroplating process, and the energized region D is configured to provide an electroplating current in the electroplating process. The invalid region C may be provided with a cutting path, and after a preparation of the antenna substrate is completed, the cutting device may cut along the cutting channel, cutting off the energized region D and the invalid region C, and retaining the valid region to obtain a transparent antenna. In some examples, the valid region may be in a shape of rectangle, and the invalid region C and the energized region D may be in a shape of rectangular rings. However, this embodiment is not limited thereto. For example, the valid region may be in a shape of circular or elliptical, and the invalid region may be in a shape of annular. In some examples, when the antenna substrate includes a plurality of valid regions, a periphery of each valid region may be surrounded by the invalid region, and a region between adjacent invalid regions may all be energized regions.

In some exemplary implementations, as shown in FIG. 3, the valid region may include a visual compensation region B and at least one antenna region A. All the regions in the valid region except the antenna region A is the visual compensation region B. The antenna region A may be located at a side of the visual compensation region B. For example, the antenna region A may be located at a center position of a lower side of the visual compensation region B. An area of the antenna region A may be smaller than an area of the visual compensation region B. However, this embodiment is not limited thereto. For example, the valid region may include a visual compensation region and two antenna regions which may be located on opposite sides of the visual compensation region, such as left and right sides of the visual compensation region.

In some exemplary implementations, the visual compensation region B may be cut during a cutting process to adapt to a shape of an electronic device. As shown in FIG. 3, four corners of the visual compensation region B may be cut to form a valid region with rounded corners. For example, after the transparent antenna prepared by the present exemplary embodiment is arranged in the display apparatus, and an orthographic projection of the valid region on the display apparatus may be overlapped with a display region of the display apparatus, so that the display effect of the display device is not affected since the valid region has light transmittance.

In some exemplary implementations, the valid region is provided with a mesh structure. The mesh structure of the antenna region A is configured to achieve the transmitting and receiving of microwave, and the mesh structure of the visual compensation region B is configured to reduce the difference in visual perception with the antenna region A. The mesh structure of antenna region A may be modeled and simulated according to microwave characteristics. The wire widths at different positions of the mesh structure of antenna region A may be substantially the same, and an intersection point of the mesh is a natural overlap of wires in two directions. The mesh structure of visual compensation region B is only used to reduce the difference in the visual perception, and there is no need to achieve the transmitting and receiving of microwave. A pattern of the mesh structure of the antenna region A may be different from a pattern of the mesh structure of the visual compensation region B. In some examples, the mesh structure of the antenna region A may include a plurality of mesh patterns without intersecting breakpoints and a plurality of mesh patterns with intersecting breakpoints, and the mesh structure of the visual compensation region B may include a plurality of mesh patterns with intersecting breakpoints. In some examples, the antenna region A has a plurality of bonding electrodes so as to bind to a microwave signal control circuit. However, this embodiment is not limited thereto.

In some exemplary implementations, a wire width of the mesh structure of the valid region may be less than or equal to 1.5 um, and a thickness may be greater than or equal to 2 um, for example, about 2 um to 3 um. In this way, the mesh structure of the valid region may ensure a visual optical transparency of the antenna region, and may ensure that the antenna region meets the requirements of microwave circuit characteristics, thus achieving a transparent antenna.

In some exemplary implementations, the invalid region C may be provided with an invalid mesh. A pattern of the invalid mesh may be substantially the same as a pattern of the mesh structure of the valid region, and a wire width of the invalid mesh may be greater than or equal to a wire width of the mesh structure of the valid region. In some examples, wire widths at different positions of the invalid mesh may be substantially the same, for example, a range of the wire width is about 2.5 um to 4 um. Alternatively, the wire width of the invalid mesh may be gradually increased along a direction away from the valid region; and for example, a wire width of the invalid mesh close to the energized region D may be about 4 um, a wire width of the invalid mesh close to the valid region may be about 2.5 um, and a wire width of the invalid mesh may be gradually decreased in a direction along the energized region D to the valid region. Alternatively, the wire width of the invalid mesh may be increased step by step along a direction away from the valid region; and for example, along the direction away from the valid region, the wire width of the invalid mesh may be increased in the following four steps: 2.5 um, 3 um, 3.5 um and 4 um. However, this embodiment is not limited thereto.

Figure 4:
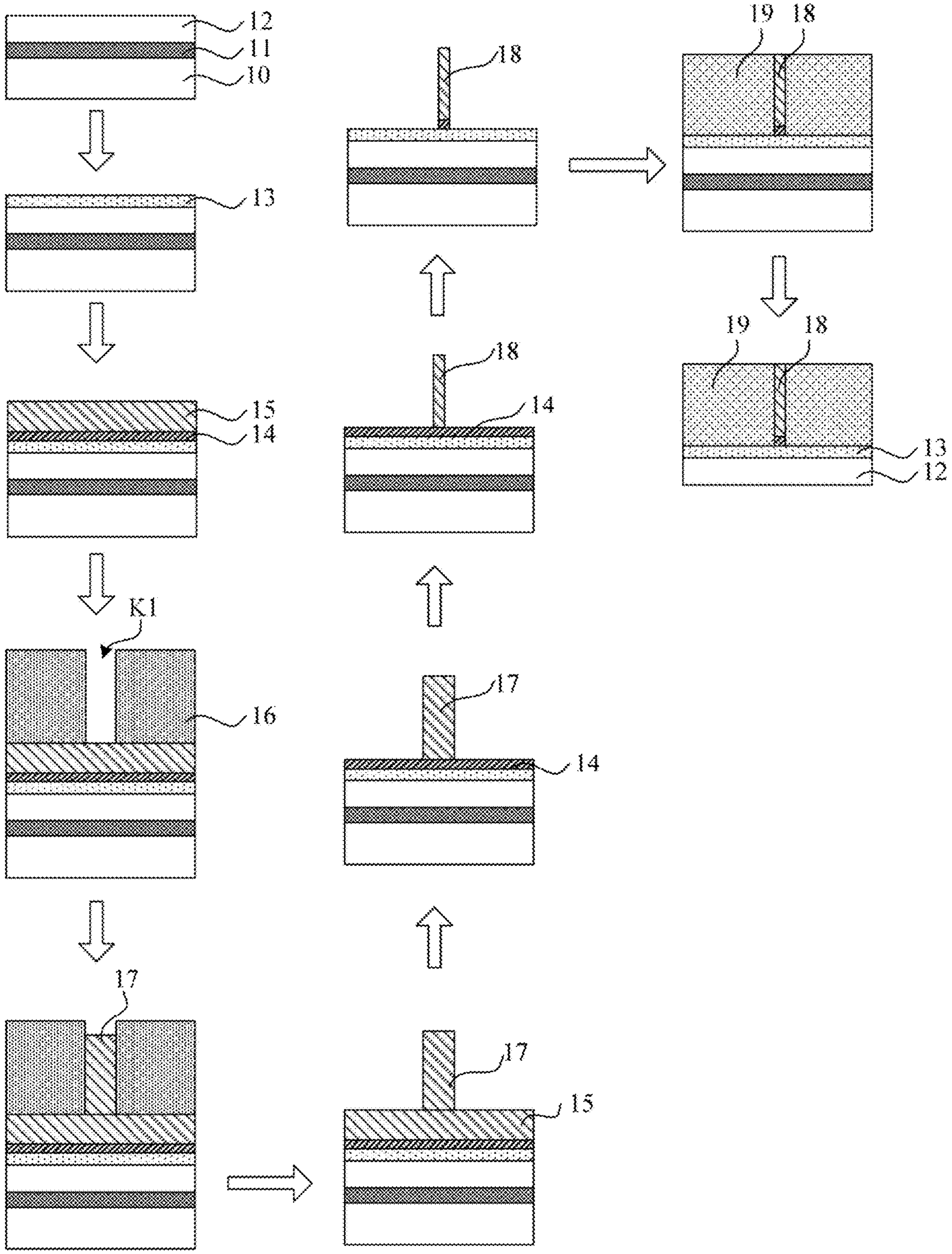
FIG. 4 is a schematic diagram of an antenna preparation flow according to at least one embodiment of the present disclosure.
Figure 5:
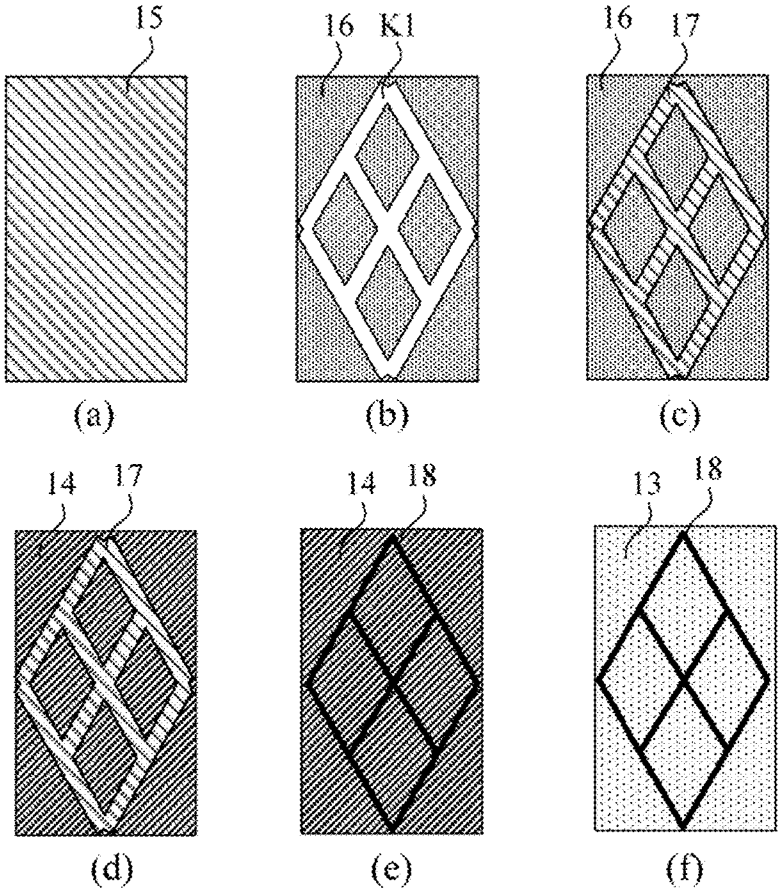
FIG. 5 is a partial plan schematic diagram of an antenna region in the antenna preparation flow shown in FIG. 4.

FIG. 4 is a schematic diagram of an antenna preparation flow according to at least one embodiment of the present disclosure. FIG. 5 is a partial plan schematic diagram of an antenna region in the antenna preparation flow shown in FIG. 4. Herein, FIG. 5 (*a*) is a partial plan schematic diagram after a seed layer is formed. FIG. 5 (*b*) is a partial plan schematic diagram after a first auxiliary patterning layer is formed. FIG. 5 (*c*) is a partial plan schematic diagram after an electroplated layer is formed. FIG. 5 (*d*) is a partial plan schematic diagram after a seed layer is etched. FIG. 5 (*e*) is a partial plan schematic diagram after an electroplated layer is etched. FIG. 5 (*f*) is a partial plan schematic diagram after an adhesive layer is etched.

In some exemplary implementations, as shown in FIG. 4 and FIG. 5, the antenna preparation flow of this embodiment may include the following steps.

(1-1) A transparent substrate 12 is prepared.

In some exemplary implementations, the flexible transparent substrate 12 is formed by coating an optical Clear Adhesive (OCA) 11 on a transparent base material 10 and then adhering a cyclic olefin polymer (COP) thin film. In some examples, the transparent base material 10 may be a hard base material such as glass or sapphire.

In some examples, the material of the transparent substrate 12 may include one of the following: glass, Polyethylene terephthalate (PET), Polycarbonate (PC), Polyimide (PI), and the like. However, this embodiment is not limited thereto.

(1-2) A buffer layer 13 is formed on the transparent substrate 12.

In some exemplary implementations, the buffer layer 13 is formed on a surface of the transparent substrate 12 away from the transparent base material 10. In some examples, an inorganic material is deposited on the surface of the transparent substrate 12 away from the transparent base material 10 to form the buffer layer 13. For example, silicon dioxide ($SiO_2$) is deposited by a low temperature CVD process to form the buffer layer 13. In some examples, a thickness of the buffer layer 13 is about 10 nm to 100 nm.

(1-3) A seed layer 15 is formed on the buffer layer 13.

In some exemplary implementations, an adhesive thin film is deposited on a surface of the buffer layer 13 away from the transparent base material 10 to form an adhesive layer 14; and subsequently a metal thin film is deposited (e.g. sputtering deposited) on the adhesion layer 14 to form a seed layer 15, as shown in FIG. 5 (*a*). The adhesion layer 14 is configured to increase an adhesion between the seed layer 15 and the buffer layer 13.

In some examples, the adhesive layer 14 may be made of a metal material, such as titanium (Ti) or molybdenum (Mo), or may be made of an alloy material, such as MTD (i.e. an alloy material containing molybdenum (Mo) and titanium (Ti)). The seed layer 15 may be made of a metal material, such as any one or more of copper (Cu), gold (Au), tin (Sn), nickel (Ni), silver (Ag), indium tin oxide (ITO), or an alloy material of the above metals.

In some examples, a thickness of the adhesive layer 14 may be about 10 nm to 100 mm. A thickness of the seed layer 15 may be about 100 nm to 500 nm.

(1-4) A first auxiliary patterning layer 16 is formed on the seed layer 15.

In some exemplary implementations, a Photoresist (PR) is coated on a surface of the seed layer 15 away from the transparent base material 10, and a patterned first auxiliary patterning layer 16 is formed through a photoresist process of mask exposure and development, as shown in FIG. 5 (*b*). In some examples, before coating a photoresist, a Hexamethyl-Disilazane (HMDS) treatment may be performed on the surface of seed layer 15 to enhance an adhesion of the photoresist to the metal surface.

In some exemplary implementations, the first auxiliary patterning layer 16 has a first groove K1 which exposes the surface of the seed layer 15. As shown in FIG. 5 (*b*), the first groove K1 of the first auxiliary patterning layer 16 is in a mesh shape in the valid region. A mesh pattern of the first groove K1 in the valid region may be substantially the same as the pattern of the mesh structure, and a width of the first groove K1 may be greater than the wire width of the mesh structure. A first groove of the invalid region in the first auxiliary patterning layer 16 may be in a mesh shape, a mesh pattern of the first groove of the invalid region may be substantially the same as the pattern of the invalid mesh of the invalid region, and a width of the first groove of the invalid region may be greater than the wire width of the invalid mesh. The width of the first groove of the invalid region may be greater than or equal to the width of the first groove of the valid region. The first auxiliary patterning layer 16 of the energized region is completely removed to expose the surface of the seed layer 15.

In some exemplary implementations, a design width of the first groove K1 of the valid region may be less than 1.5 um. After the design through an exposure dose and a development condition, a bottom surface and a sidewall of the first groove K1 of the valid region may be substantially perpendicular, and the width of the first groove K1 may be less than 4 um, for example.

In an exemplary implementation, a thickness of the first auxiliary patterning layer 16 may be about 2 um to 5 um. The thickness of the first auxiliary patterning layer 16 may be determined according to a thickness required for the mesh structure. By adjusting the thickness of the first auxiliary patterning layer, the thickness of the mesh structure may be changed.

In some exemplary implementations, the photoresist may be selected from a low-temperature curing adhesive material, and the curing temperature is not higher than a tolerant temperature of the COP thin film and OCA, for example, the curing temperature may be about 140 C.

(1-5) An electroplated layer 17 is prepared. The electroplated layer 17 in this example is the conductive layer in the above embodiment.

In some exemplary implementations, the electroplated layer 17 is formed in the first groove K1 of the first auxiliary patterning layer 16 through an electroplating process, as shown in FIG. 5 (*c*). The electroplated layer 17 may be in the form of a mesh. The electroplated layer 17 is in direct contact with the surface of the seed layer 15 in the first groove K1. In some examples, a Redistribution Layer (RDL) electroplating process is used, an acidic electroplating liquid (e.g. copper sulfate ($CuSO_4$)+sulfuric acid ($H_2SO4$)+additive) is used for rotary electroplating, and an electroplating rate may be controlled between 0.03 um/min and 0.2 um/min. A thickness of the electroplated layer 17 may be about 3 um to 5 um.

In this example, as shown in FIG. 4, the thickness of the electroplated layer 17 may be smaller than the thickness of the first auxiliary patterning layer 16. The electroplated layer 17 of the valid region and the invalid region may be located in the first groove of the first auxiliary patterning layer 16, and the energized region may be covered by the electroplated layer 17.

(1-6) the first auxiliary patterning layer 16 is removed.

In some exemplary implementations, the first auxiliary patterning layer 16 is removed by using a strip solution for photoresist cleaning, and performing a deionized water rinsing and CDA air drying to expose the electroplated layer 17 and the seed layer 15.

(1-7) The seed layer 15 is etched.

In some exemplary implementations, the seed layer 15 is etched by using a wet etching process to remove the seed layer 15 not covered by the electroplated layer 17, i.e. to retain the seed layer 15 covered by the electroplated layer 17, as shown in FIG. 5 (*d*). After the etching in this step, the seed layer 15 not covered by the electroplated layer 17 is etched away, the adhesive layer 14 is exposed, and a part of the electroplated layer 17 far away from the transparent base material 10 is also etched.

In some examples, taking that a material of seed layer 15 is Cu as an example, a hydrogen peroxide-based etching solution (e.g. sulfuric acid ($H_2SO_4$) content is about 2% to 3%, additive content is about 2% to 3%, and hydrogen peroxide ($H_2O_2$) concentration is about 0.1% to 1%) may be used for etching for a certain time until the color, i.e. copper color, of the seed layer 15 is disappeared.

(1-8) The electroplated layer 17 is etched.

In some exemplary implementations, the electroplated layer 17 is etched by using a wet etching process to narrow the wire width of the metal wires of the electroplated layer 17 to form a mesh structure 18, as shown in FIG. 5 (*e*).

In some examples, taking that a material of the electroplated layer 17 is Cu as an example, a hydrogen peroxide-based etching solution (e.g. $H_2SO_4$ content is about 2% to 4%, additive content is about 2% to 3%, and $H_2O_2$ concentration is about 0.01% to 0.2%) may be used for etching for a certain time until the wire width of the electroplated layer 17 reaches a target wire width, e.g. 1.5 um. In this step, the metal wire may be slowly etched with a lower hydrogen peroxide concentration, so as to achieve over-etching of the metal wire to achieve the target wire width.

(1-9) The adhesive layer 14 is etched.

In some exemplary implementations, the adhesive layer 14 is etched to remove the adhesive layer 14 not covered by the mesh structure 18, i.e. to retain the adhesive layer 14 covered by the mesh structure 18, as shown in FIG. 5 (*f*). In this example, by etching the adhesive layer 14, the adhesive layer 14 may be formed the same pattern as the mesh structure 18. For example, an orthographic projection of the mesh structure 18 on the transparent base material 10 may substantially coincide with an orthographic projection of the adhesive layer 14 on the transparent base material 10.

In some examples, the adhesive layer 14 may be etched by using a wet etching process or a dry etching process. Taking that a material of the adhesive layer 14 is the metal Ti as an example, in the wet etching process, the etching solution with fine control formula may be selected, which only has a corrosive effect on Ti without damaging the electroplated layer 17 made of Cu. Taking the material of the adhesive layer 14 is MTD as an example, dry etching may be performed by Ion Beam Etching (IBE). However, this embodiment is not limited thereto.

(1-10) An optical over coat layer 19 is formed.

In some exemplary implementations, an optical adhesive is coated on the transparent base material 10 formed with the aforementioned structure, and after planarization, an optical Over Coat (OC, Over Coat) layer 19 is formed. A surface of the mesh structure 18 away from the transparent base material 10 may be flush with a surface of the optical over coat layer 19 away from the transparent base material 10.

In some examples, the optical adhesive may be SOC-5004U. A thickness of optical adhesive may be about 3 um to 4 um. A curing temperature of optical adhesive may not be higher than a tolerant temperature of COP thin film and OCA, for example, the curing temperature may be about 140 C. In other examples, the optical adhesive may be an adhesive material cured by ultraviolet.

(1-11) A substrate is peeled off (Delami), and a cutting treatment is performed.

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

The preparation process of the exemplary implementation adopts only one lithography process, and the preparation process is simple. Moreover, a preparation process at a low temperature (e.g. 140° C.) is supported, and the flexible transparent substrate is not easily damaged. The preparation process according to the present embodiment may be achieved using an existing mature preparation device, and may be well compatible with an existing manufacturing process. The process is simple to achieve, easy to implement, high in efficiency of production, low in production cost, and high in yield.

Figure 6:
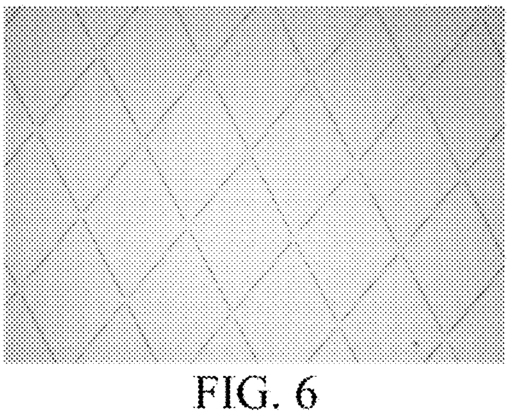
FIG. 6 is a partial plan schematic diagram of a mesh structure under an optical microscope obtained by using the preparation flow shown in FIG. 4.
Figure 7:
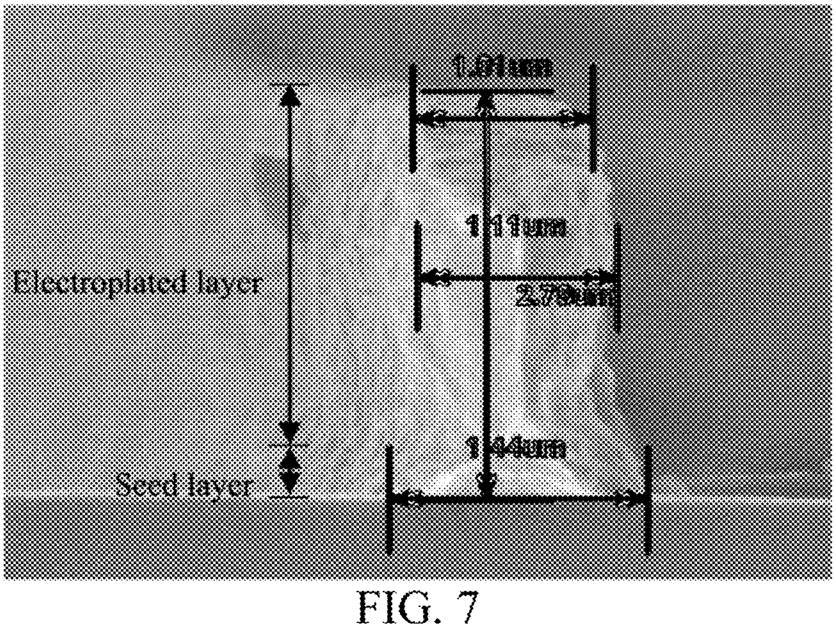
FIG. 7 and FIG. 8 are schematic cross-sectional views of a metal wire under a scanning electron microscope obtained by using the preparation flow shown in FIG. 4.
Figure 8:
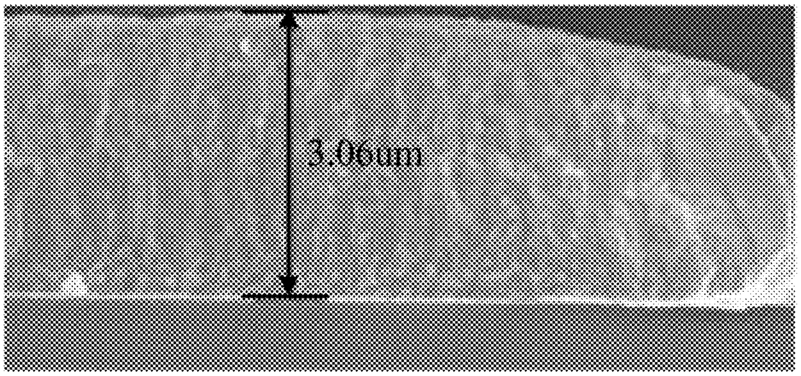

FIG. 6 is a partial plan schematic diagram of a mesh structure under an Optical Microscope (OM) obtained by using the preparation flow shown in FIG. 4. FIG. 7 and FIG. 8 are schematic cross-sectional views of metal wires under Scanning Electron Microscope (SEM) obtained by the preparation process shown in FIG. 4. FIG. 7 is a schematic cross-sectional view of the wire in a width direction, and FIG. 8 is a schematic cross-sectional view of the wire in an extension direction.

In some exemplary implementations, as shown in FIG. 6, the preparation method of the sensing device according to this embodiment may control the wire width of the metal wire of the mesh structure to be less than or equal to 1.5 um, so that the transparent antenna has higher optical transparency, and the visual transparency requirement may be achieved.

In some exemplary implementations, as shown in FIG. 7, a cross section of the wire of the mesh structure in the width direction is substantially columnar, and a bottom surface and a sidewall of the metal wire are substantially perpendicular to each other. After etching, a width of the seed layer close to the transparent substrate is greater than a width away from the transparent substrate, for example, the width close to the transparent substrate is about 1.44 um. The wire width at the interface between seed layer and electroplated layer is obviously narrowed. After etching, the electroplated layer has a rough morphology corroded by liquid, and the wire width of the metal wire gradually decreases in a direction away from the seed layer, for example, a wire width close to the seed layer is about 1.11 um, and a wire width away from the seed layer is about 1.01 um. As shown in FIG. 7 and FIG. 8, a thickness of the metal wire may be a sum of the average thicknesses of the electroplated layer and the seed layer after etching, for example about 2 um to 3 um. Along with an extension direction of the wire, the thicknesses at the different positions may be substantially the same, for example, a thickness of the metal wire in a middle region in the extension direction may be about 3.06 um, and may be about 2.79 um at the ends of the metal wire.

Figure 9:
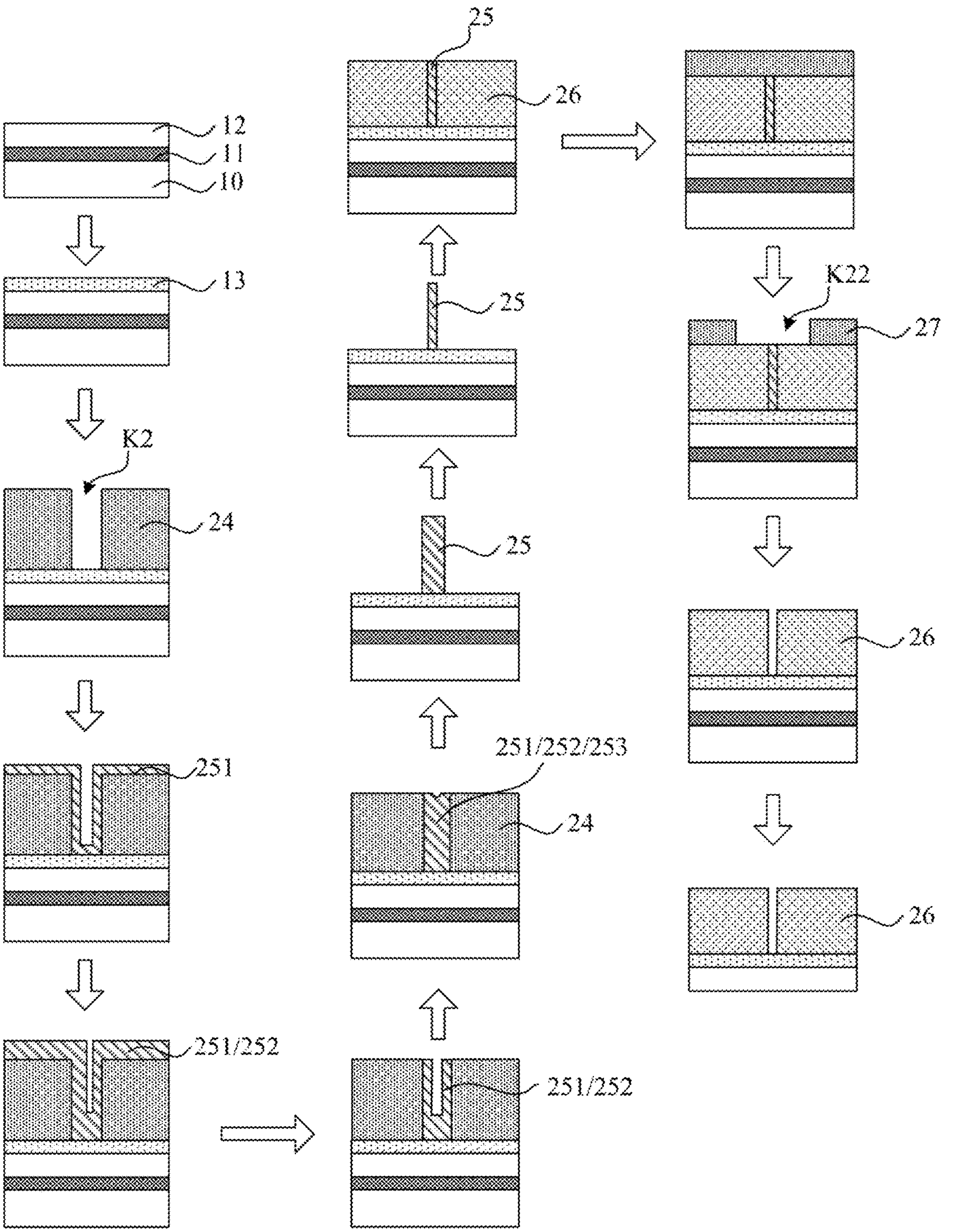
FIG. 9 is a schematic diagram of yet another antenna preparation flow according to at least one embodiment of the present disclosure.
Figure 10:
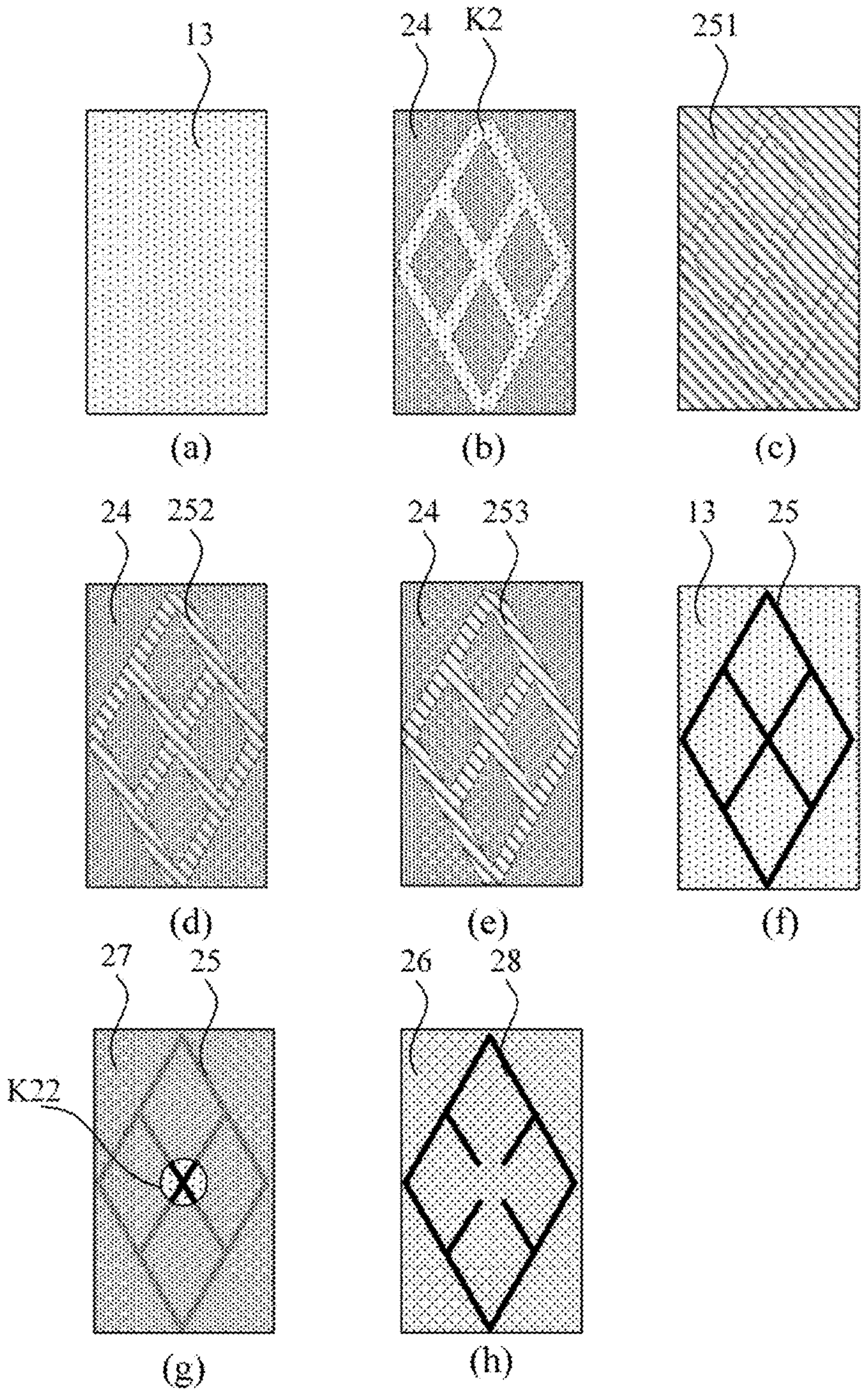
FIG. 10 is a partial plan schematic diagram of an antenna region during an antenna preparation flow shown in FIG. 9.

FIG. 9 is a schematic diagram of yet another antenna preparation flow according to at least one embodiment of the present disclosure. FIG. 10 is a partial plan schematic diagram of an antenna region in the antenna preparation process shown in FIG. 9. Herein, FIG. 10 (*a*) is a partial plan schematic diagram after a buffer layer is formed. FIG. 10 (*b*) is a partial plan schematic diagram after a first auxiliary patterning layer is formed. FIG. 10 (*c*) is a partial plan schematic diagram after a seed layer is formed. FIG. 10 (*d*) is a partial plan schematic diagram after a first electroplated layer is formed and a high-pressure rinse is performed. FIG. 10 (*e*) is a partial plan schematic diagram after a second electroplated layer is formed. FIG. 10 (*f*) is a partial plan schematic diagram after a first auxiliary patterning layer is removed and a conductive layer is etched. FIG. 10 (*g*) is a partial plan schematic diagram after a second photoresist layer is formed. FIG. 10 (*h*) is a partial plan schematic diagram after a mesh structure is formed.

In some exemplary implementations, as shown in FIG. 9 and FIG. 10, the antenna preparation flow of this embodiment may include the following steps.

(2-1) A transparent substrate 12 is prepared.

In some exemplary implementations, the flexible transparent substrate 12 is formed by coating an optical adhesive (such as OCA) 11 on a transparent base material 10 and then adhering a cyclic olefin polymer (COP) thin film. In some examples, the transparent base material 10 may be a hard base material such as glass or sapphire.

(2-2) A buffer layer 13 is formed on the transparent substrate 12.

In some exemplary implementations, the buffer layer 13 is formed on a surface of the transparent substrate 12 away from the transparent base material 10, as shown in FIG. 10 (*a*). In some examples, an inorganic material is deposited on the surface of the transparent substrate 12 away from the transparent base material 10 to form the buffer layer 13. For example, silicon dioxide (SiO2) is deposited by a low temperature CVD process to form the buffer layer 13. In some examples, a thickness of the buffer layer 13 is about 10 nm to 100 nm.

(2-3) A first auxiliary patterning layer 24 is formed on the buffer layer 13.

In some exemplary implementations, a photoresist is coated on a surface of the buffer layer 13 away from the transparent base material 10, and a patterned first auxiliary patterning layer 24 is formed through a photoresist process of mask exposure and development, as shown in FIG. 10 (*b*). In some examples, before coating a photoresist, an HMDS treatment may be performed on a surface of the buffer layer 13 to enhance an adhesion of the photoresist.

In some exemplary implementations, the first auxiliary patterning layer 24 has a second groove K2 which exposes the surface of the buffer layer 13. As shown in FIG. 10 (*b*), the second groove K2 of the first auxiliary patterning layer 24 is in a mesh shape in the valid region. A mesh pattern of the second groove K2 in the valid region may be substantially the same as the pattern of the mesh structure, and a width of the second groove K2 may be greater than the wire width of the mesh structure. A second groove of the invalid region of the first auxiliary patterning layer 24 may be in a mesh shape, a mesh pattern of the second groove of the invalid region may be substantially the same as the pattern of the invalid mesh of the invalid region, and a width of the second groove of the invalid region may be greater than the wire width of the invalid mesh. The width of the second groove of the invalid region may be greater than or equal to the width of the second groove of the valid region. The first auxiliary patterning layer 24 of the energized region is completely removed to expose the surface of the buffer layer 13.

In some exemplary implementations, a design width of the second groove K2 of the valid region may be less than 1.5 um. After the design through an exposure dose and a development condition, a bottom surface and a sidewall of the second groove K2 of the valid region may be substantially perpendicular, and the width of the second groove K2 may be less than 3 um, for example.

In an exemplary implementation, a thickness of the first auxiliary patterning layer 24 may be about 2 um to 5 um. The thickness of the first auxiliary patterning layer 16 may be determined according to a thickness required for the mesh structure. By adjusting the thickness of the first auxiliary patterning layer, the thickness of the mesh structure may be changed.

In some exemplary implementations, the photoresist may be selected from a low-temperature curing adhesive material, and the curing temperature is not higher than a tolerant temperature of the COP thin film and OCA, for example, the curing temperature may be about 140 C.

(2-4) A seed layer 251, a first electroplated layer 252, and a third electroplated layer 253 are prepared. In this example, the conductive layer 25 may include a seed layer 251, a first electroplated layer 252 and a second electroplated layer 253 which are sequentially stacked in the groove.

In some exemplary implementations, a metal thin film is deposited on the transparent base material 10 formed with the aforementioned structure to form the seed layer 251 covering the entire transparent base material 10, as shown in FIG. 10 (*c*). Then, a first electroplated layer 252 is formed on the seed layer 251 by an electroplating process, wherein the first electroplated layer 252 covers the entire transparent base material 10. Then, a high-pressure rinsing or an ultrasonic cleaning is performed on the entire transparent base material 10 by using deionized water to remove the first electroplated layer 252 and the seed layer 251 on the surface of the first auxiliary patterning layer 24 away from the transparent base material 10, retaining only the first electroplated layer 252 and the seed layer 251 in the second groove K2. Then, a second electroplated layer 253 is formed in the second groove K2 by an electroplating process, and the second electroplated layer 253 is in direct contact with the first electroplated layer 252, as shown in FIG. 10 (*e*). The conductive layer 25 is in a mesh shape. In some examples, the electroplating process forming the first electroplated layer 252 is a surface electroplating process which may adopt a current density matching electroplating liquid in 10% to 30%; and the electroplating process for forming the second electroplated layer 253 is a wire electroplating process, which may adopt a current density of the matching electroplating liquid.

Figure 11:
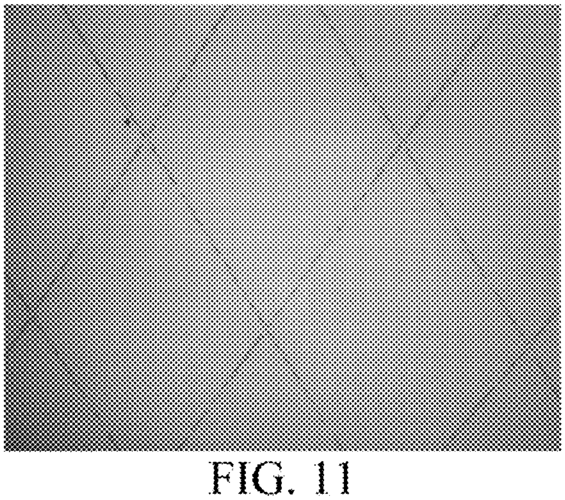
FIG. 11 is a partial plan schematic diagram under an optical microscope of an antenna region after a first electroplated layer is formed and a high-pressure rinse is performed in the preparation flow shown in FIG. 9.

FIG. 11 is a partial plan schematic diagram of an antenna region under an optical microscope after a first electroplated layer is formed and a high-pressure rinse is performed in the antenna preparation flow shown in FIG. 9. As shown in FIG. 11, after the first electroplated layer 252 is formed and a high-pressure rinsing is performed, the first electroplated layer 252 and the seed layer 251 of the first auxiliary patterning layer 24 away from a surface of the transparent base material 10 are removed, and the seed layer 251 and the first electroplated layer 252 in the second groove K2 of the first auxiliary patterning layer 24 may be retained.

(2-5) The first auxiliary patterning layer 24 is removed.

In some exemplary implementations, the first auxiliary patterning layer 24 is removed by using a strip solution for photoresist cleaning, and performing a deionized water cleaning and CDA air drying to expose the conductive layer 25 and the butter layer 13.

(2-6) The conductive layer 25 is etched.

In some exemplary implementations, the conductive layer 25 is etched by using a wet etching process to narrow the wire width of the metal wires of the conductive layer 25, as shown in FIG. 10 (*f*).

In some examples, taking that a material of the conductive layer 25 is Cu as an example, a hydrogen peroxide-based etching solution (e.g. $H_2SO_4$ content is about 2% to 4%, additive content is about 2% to 3%, and $H_2O_2$ concentration is about 0.01% to 0.2%) may be used for etching for a certain time until the wire width of the conductive layer 25 reaches a target wire width, e.g. 1.5 um. In this step, the metal wire may be slowly etched with a lower hydrogen peroxide concentration, so as to achieve over-etching of the metal wire to achieve the target wire width.

(2-7) An optical over coat layer 26 is formed.

In some exemplary implementations, an optical adhesive is coated on the transparent base material 10 formed with the aforementioned structure, and after planarization, an optical over coat layer 26 is formed. A surface of the etched conductive layer 25 away from the transparent base material 10 may be flush with a surface of the optical over coat layer 26.

(2-8) A second photoresist layer 27 is formed.

In some exemplary implementations, a photoresist is coated on the transparent base material 10 formed with the aforementioned structure, and a patterned second photoresist layer 27 is formed through mask exposure and development, as shown in FIG. 10 (*g*). The second photoresist layer 27 has a first via hole K22 which exposes the conductive layer 25 at the intersecting position of the wires.

(2-9) The conductive layer 25 is etched.

In some exemplary implementations, the conductive layer 25 is etched by using a wet etching process to remove the conductive layer 25 at the intersecting position of the wires exposed by the second photoresist layer 27 to remove mesh intersecting points which need to be disconnected to form the mesh structure 28.

(2-10) The second photoresist layer 27 is removed, a substrate is peeled off, and a cutting treatment is performed.

In some exemplary implementations, the second photoresist layer 27 is removed by using a strip solution for photoresist cleaning, and performing deionized water cleaning and CDA air drying to expose the mesh structure 28 and the optical over coat layer 26, as shown in FIG. 10 (h).

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

In the present exemplary implementation, since only the seed layer and the first electroplated layer are present in the second groove after a high-pressure rinsing is performed on the first electroplated layer and the seed layer, the seed layer and the first electroplated layer in the second groove become the only path of the electroplating current in the wire electroplating process when the second electroplated layer is formed by using a wire electroplating process. There are mesh patterns with intersecting breakpoints in the mesh structure of the valid region. In order to prepare a mesh pattern with intersecting breakpoints based on a wire electroplating process, the mesh pattern of the second groove needs to adopt a connection design (i.e. a mesh pattern without intersecting breakpoints), and after the mesh pattern without intersecting breakpoints is obtained through a wire electroplating process, the intersecting breakpoints of the mesh are formed by an etching process (i.e. steps (2-8) and (2-9)). In other embodiments using a surface electroplating process, a groove pattern of the first auxiliary patterning layer in the valid region may be substantially the same as the pattern of the mesh structure without additional etching processes of the intersecting breakpoints.

According to the preparation method according to the present exemplary implementation, a first electroplated layer is formed through an entire surface pre-electroplating, and a wire electroplating is performed in the groove after a metal outside the groove is peeled off. The disconnected intersecting points of the mesh structures are removed through a wet etching process after electroplating. The preparation method of the present embodiment does not need a separate etching process of the seed layer, so that the preparation steps may be reduced and a risk that the metal wires are peeled off due to the etching of the seed layer may be avoided.

Figure 12:
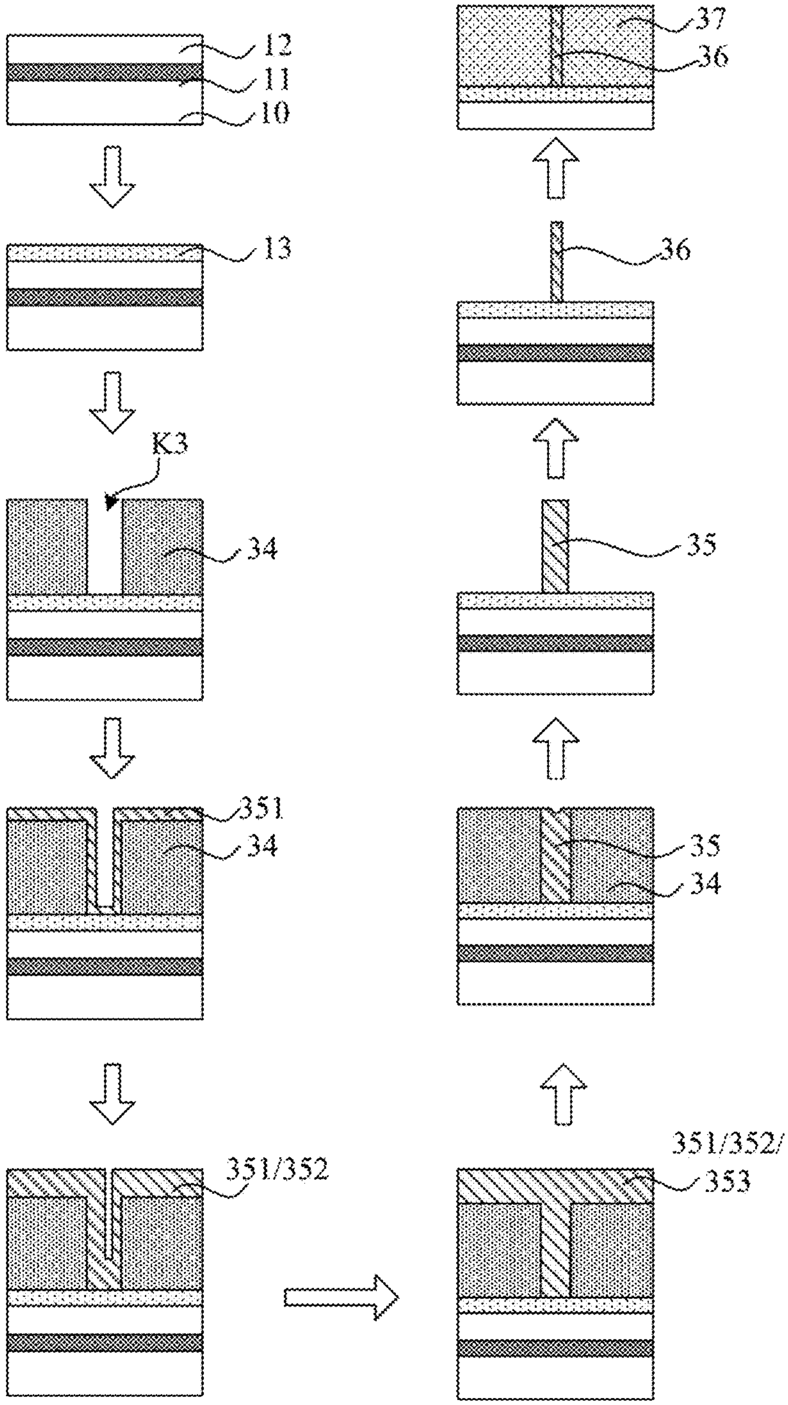
FIG. 12 is a schematic diagram of yet another antenna preparation flow according to at least one embodiment of the present disclosure.
Figure 13:
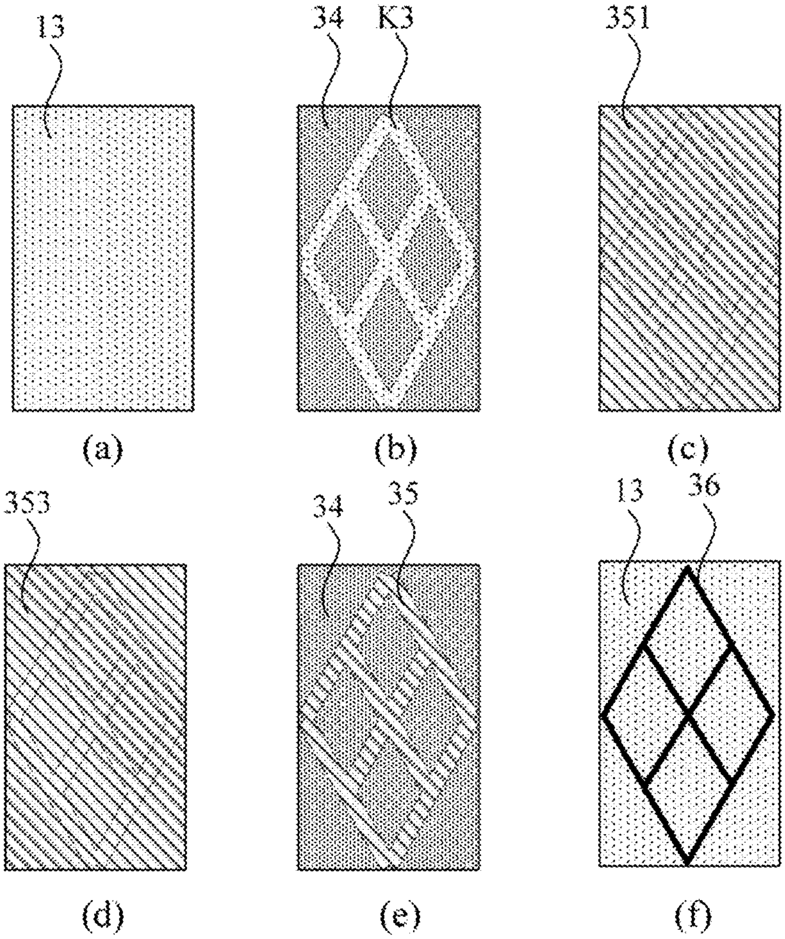
FIG. 13 is a partial plan schematic diagram of an antenna region in the antenna preparation flow shown in FIG. 12.

FIG. 12 is a schematic diagram of yet another antenna preparation flow according to at least one embodiment of the present disclosure. FIG. 13 is a partial plan schematic diagram of an antenna region in the antenna preparation flow shown in FIG. 12. Herein, FIG. 13 (*a*) is a partial plan schematic diagram after a buffer layer is formed. FIG. 13 (*b*) is a partial plan schematic diagram after a first auxiliary patterning layer is formed. FIG. 13 (*c*) is a partial plan schematic diagram after a seed layer is formed. FIG. 13 (*d*) is a partial plan schematic diagram after a second electroplated layer is formed. FIG. 13 (*e*) is a partial plan schematic diagram after a conductive layer is etched. FIG. 13 (*f*) is a partial plan schematic diagram after a mesh structure is formed by removing the first auxiliary patterning layer and etching the conductive layer.

In some exemplary implementations, as shown in FIG. 12 and FIG. 13, the antenna preparation flow of this embodiment may include the following steps.

(3-1) A transparent substrate 12 is prepared.

In some exemplary implementations, the flexible transparent substrate 12 is formed by coating an optical adhesive (OCA) 11 on a transparent base material 10 and then adhering a cyclic olefin polymer (COP) thin film. In some examples, the transparent base material 10 may be a hard base material such as glass or sapphire.

(3-2) A buffer layer 13 is formed on the transparent substrate 12.

In some exemplary implementations, the buffer layer 13 is formed on a surface of the transparent substrate 12 away from the transparent base material 10, as shown in FIG. 13 (*a*). In some examples, an inorganic material is deposited on the surface of the transparent substrate 12 away from the transparent base material 10 to form the buffer layer 13. For example, silicon dioxide ($SiO_2$) is deposited by a low temperature CVD process to form the buffer layer 13. In some examples, a thickness of the buffer layer 13 is about 10 nm to 100 nm.

(3-3) A first auxiliary patterning layer 34 is formed on the buffer layer 13.

In some exemplary implementations, a photoresist is coated on a surface of the buffer layer 13 away from the transparent base material 10, and a patterned first auxiliary patterning layer 34 is formed through a photoresist process of mask exposure and development, as shown in FIG. 13 (*b*).

In some exemplary implementations, the first auxiliary patterning layer 34 has a third groove K3, and the second groove 23 exposes the surface of the buffer layer 13. The description of the first auxiliary patterning layer 34 and the third groove K3 may be referred to the description of the first auxiliary patterning layer 24 and the second groove K2 in the previous embodiment, and therefore will not be repeated here.

(3-4) A seed layer 351, a first electroplated layer 352, and a second electroplated layer 353 are prepared. In this example, the conductive layer 35 may include a seed layer 351, a first electroplated layer 352 and a second electroplated layer 353 which are sequentially stacked in the groove.

In some exemplary implementations, a metal thin film is deposited on the transparent base material 10 forming the aforementioned structure to form a seed layer 351 covering the entire transparent base material 10, as shown in FIG. 13 (*c*). Then a first electroplated layer 352 and a second electroplated layer 353 are sequentially formed on the seed layer 351 by an electroplating process. Then, the seed layer 351, the first electroplated layer 352, and the second electroplated layer 353 of the surface of the first auxiliary patterning layer 34 away from the transparent base material 10 are etched through a wet etching process to remove the seed layer 351, the first electroplated layer 352, and the second electroplated layer 353 of the surface of the first auxiliary patterning layer 35 away from the transparent base material 10, retaining only the seed layer 351, the first electroplated layer 352, and the second electroplated layer 353 in the third groove K3 to form a conductive layer 35, as shown in FIG. 13 (*e*). The conductive layer 35 is in a mesh shape. However, this embodiment is not limited thereto. In other examples, taking that the material of the conductive layer 35 is Cu as an example, the seed layer 351, the first electroplated layer 352, and the second electroplated layer 353 may be thinned by using Chemical Mechanical Polishing (CMP) to remove the seed layer 351, the first electroplated layer 352, and the second electroplated layer 353 of the surface of the first auxiliary patterning layer 35 away from the transparent base material 10.

In some examples, the electroplating process for forming the first electroplated layer 352 is a surface electroplating process which may adopt a current density matching the electroplating liquid by 10% to 30%; and the electroplating process for forming the second electroplated layer 353 is a surface electroplating process, which may adopt a current density matching the electroplating liquid.

(3-5) The first auxiliary patterning layer 34 is removed.

In some exemplary implementations, the first auxiliary patterning layer 34 is removed by using a strip solution for photoresist cleaning, and performing deionized water cleaning and CDA air drying to expose the conductive layer 35 and the buffer layer 13.

(3-6) The conductive layer 35 is etched.

In some exemplary implementations, the conductive layer 35 is etched by using a wet etching process to narrow the wire width of the metal wires of the conductive layer 35 to form a mesh structure 36, as shown in FIG. 13 (*f*).

(3-7) An optical over coat layer 37 is formed.

In some exemplary implementations, an optical adhesive is coated on the transparent base material 10 formed with the aforementioned structure, and after planarization, an optical over coat layer 37 is formed. A surface of the mesh structure 36 away from the transparent base material 10 may be flush with a surface of the optical over coat layer 37.

(3-8) A substrate is peeled off, and a cutting treatment is performed.

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

Through the preparation method according to the present exemplary implementation, after a first electroplated layer and a second electroplated layer are formed by using a complete electroplating process, a conductive layer having a mesh shape is formed by etching a metal outside the groove, and then the conductive layer is etched through a wet etching process to achieve a mesh structure meeting the wire width and thickness condition. The preparation method of the present embodiment does not need a separate etching process of the seed layer, so that the preparation steps may be reduced and a risk that the metal wires are peeled off due to the etching of the seed layer may be avoided. Moreover, compared with the previous embodiment, the embodiment may omit the wire electroplating process and the disconnecting flow of the intersecting points, thus reducing the complexity and risk of the preparation process.

Figure 14:
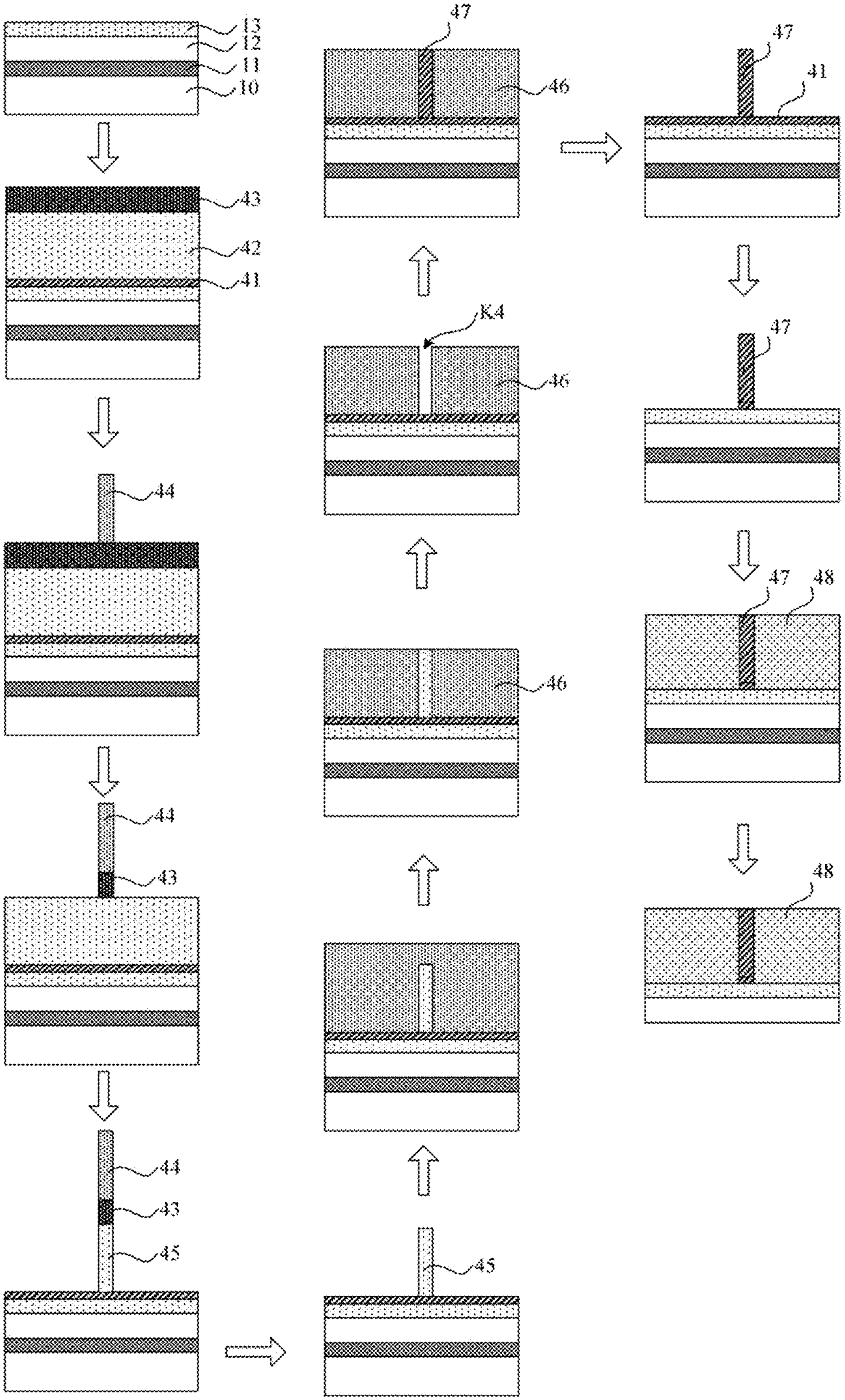
FIG. 14 is a schematic diagram of yet another antenna preparation flow according to at least one embodiment of the present disclosure.
Figure 15:
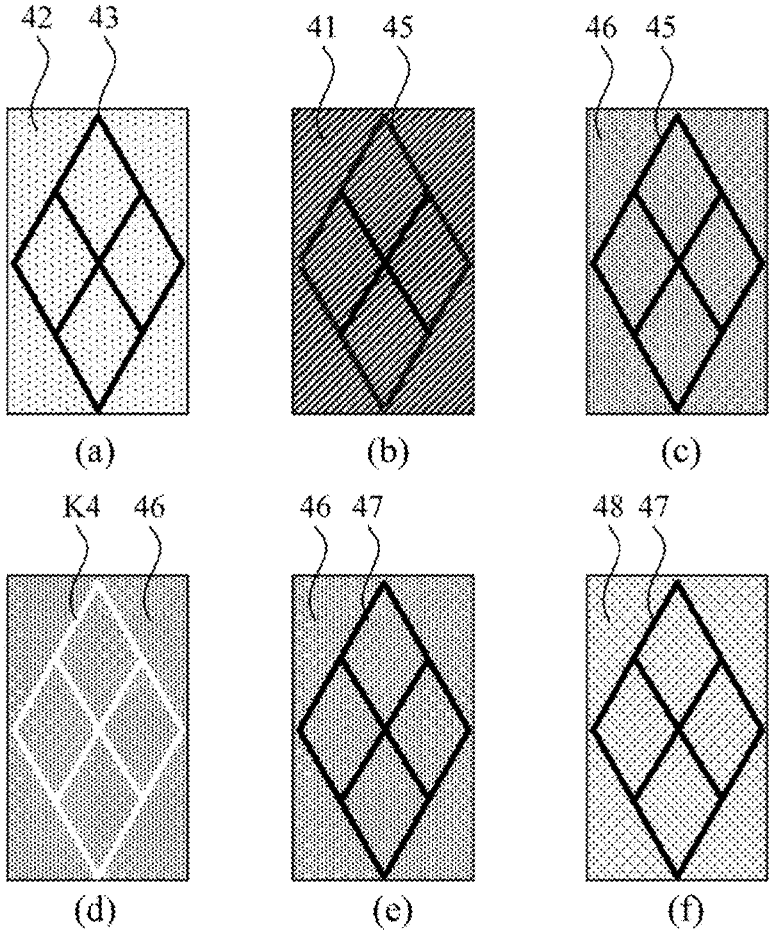
FIG. 15 is a partial plan schematic diagram of an antenna region in the antenna preparation flow shown in FIG. 14.

FIG. 14 is a schematic diagram of yet another antenna preparation flow according to at least one embodiment of the present disclosure. FIG. 15 is a partial plan schematic diagram of an antenna region in the antenna preparation flow shown in FIG. 14. Herein, FIG. 15 (*a*) is a partial plan schematic diagram after a hard mask is etched. FIG. 15 (*b*) is a partial plan schematic diagram after a second auxiliary patterning layer is formed. FIG. 15 (*c*) is a partial plan schematic diagram after a photoresist is coated on the second auxiliary patterning layer. FIG. 15 (*d*) is a partial plan schematic diagram after a first auxiliary patterning layer is formed. FIG. 15 (*e*) is a partial plan schematic diagram after a first auxiliary patterning layer is removed. FIG. 15 (*f*) is a partial plan schematic diagram after a seed layer is etched.

In some exemplary implementations, as shown in FIG. 14 and FIG. 15, the antenna preparation flow of this embodiment may include the following steps.

(4-1) A transparent substrate 12 is prepared.

In some exemplary implementations, the OCA 11 is coated on the transparent base material 10 and then a COP thin film is attached to form a flexible transparent substrate 12. In some examples, the transparent base material 10 may be a hard base material such as glass or sapphire.

(4-2) A buffer layer 13 is formed on the transparent substrate 12.

In some exemplary implementations, the buffer layer 13 is formed on a surface of the transparent substrate 12 away from the transparent base material 10. In some examples, an inorganic material is deposited on the surface of the transparent substrate 12 away from the transparent base material 10 to form the buffer layer 13. For example, silicon dioxide ($SiO_2$) is deposited by a low temperature CVD process to form the buffer layer 13. In some examples, a thickness of the buffer layer 13 is about 10 nm to 100 nm.

(4-3) A seed layer 41 is formed on the buffer layer 13.

In some exemplary implementations, a metal thin film is deposited on a surface of the buffer layer 13 away from the transparent base material 10 to form a seed layer 41. In some examples, the seed layer 41 may be made of a metal material, such as any one or more of copper (Cu), gold (Au), tin (Sn), nickel (Ni), silver (Ag), indium tin oxide (ITO), or an alloy material of the above metals. A thickness of the seed layer 41 may be about 100 nm to 500 nm.

(4-4) A second auxiliary patterning thin film 42, a hard mask 43, and a patterned first photoresist layer 44 are sequentially formed on the seed layer 41.

In some exemplary implementations, a second auxiliary patterning thin film 42 and a hard mask 43 are sequentially formed on a surface of the seed layer 41 away from the transparent base material 10. In some examples, silicon dioxide ($SiO_2$) may be deposited on the surface of the seed layer 41 away from the transparent base material 10 in a low-temperature CVD manner to form the second auxiliary patterning thin film 42, and a hard mask 43 may be deposited and formed on the second auxiliary patterning thin film 42 in a low-temperature CVD manner. In some examples, a material of the hard mask 43 may be a metal material or a conductive oxide (e.g. ITO). In some examples, a thickness of the second auxiliary patterning thin film 42 is about 2 um. However, this embodiment is not limited thereto.

In some exemplary implementations, a photoresist is coated on a surface of the hard mask 43 away from the transparent base material 10, and a patterned first photoresist layer 44 is formed through a photolithography process of mask exposure and development.

(4-5) The hard mask 43 and the second auxiliary patterning thin film 42 are etched by using the first photoresist layer 44 to form the second auxiliary patterning layer 45.

In some exemplary implementations, the hard mask 43 is etched by using a wet etching process to remove the hard mask 43 not covered by the first photoresist layer 44, as shown in FIG. 15 (*a*). Subsequently, the second auxiliary patterning thin film 42 is etched by using a dry etching process (e.g., an Inductively Coupled Plasma (ICP) etching process), and the second auxiliary patterning thin film 42 not covered by the hard mask 43 is etched away, that is, the second auxiliary patterning thin film 42 covered by the hard mask 43 is retained to form a second auxiliary patterning layer 45, as shown in FIG. 15 (*b*). In this example, etching of the second auxiliary patterning thin film is achieved by providing a hard mask to obtain the second auxiliary patterning layer 45.

(4-6) The first photoresist layer 44 and the hard mask 43 are removed.

In some exemplary implementations, the first photoresist layer 44 is removed by using a strip solution for photoresist cleaning, and performing deionized water cleaning and CDA air drying to expose the hard mask 43. Subsequently the hard mask 43 is etched by using a wet etching process to remove the hard mask 43 and expose the second auxiliary patterning layer 45.

(4-7) A first auxiliary patterning layer 46 is formed.

In some exemplary implementations, a photoresist is coated on the transparent base material 10 formed with the aforementioned structure, and a planarization and ashing process is performed to form the first auxiliary patterning layer 46 as shown in FIG. 15 (*c*). A surface of the first auxiliary patterning layer 46 away from the transparent base material 10 may be flush with a surface of the second auxiliary patterning layer 45 away from the transparent base material 10.

(4-8) The second auxiliary patterning layer 45 is removed.

In some exemplary implementations, the second auxiliary patterning layer 45 is etched by using a wet etching process, the second auxiliary patterning layer 45 is removed, and a fourth groove K4 is formed in the first auxiliary patterning layer 46, as shown in FIG. 15 (*d*). The fourth groove K4 exposes a surface of the seed layer 41. In this example, a shape and a dimension of the fourth groove K4 may be substantially the same as those of the second auxiliary patterning layer 45. In some examples, a width of the fourth groove K4 may be less than 1.5 um, and a height may be greater than 2 um.

(4-9) A mesh structure 47 is formed.

In some exemplary implementations, the mesh structure 47 is formed in the fourth groove K4 of the first auxiliary patterning layer 46 through an electroplating process, as shown in FIG. 15 (*e*). The mesh structure 47 is in direct contact with the surface of the seed layer 41 in the fourth groove K4. A surface of the mesh structure 47 away from the transparent base material 10 may be flush with a surface of the first auxiliary patterning layer 46 away from the transparent base material 10.

(4-10) The first auxiliary patterning layer 46 is removed.

In some exemplary implementations, the first auxiliary patterning layer 46 is removed by using a strip solution for photoresist cleaning, and performing deionized water cleaning and CDA air drying to expose the mesh structure 47 and the seed layer 41.

(4-11) The seed layer 41 is etched.

In some exemplary implementations, the seed layer 41 is etched by using a wet etching process to remove the seed layer 41 not covered by the mesh structure 47.

(4-12) An optical over coat layer 48 is formed.

In some exemplary implementations, an optical adhesive is coated on the transparent base material 10 formed with the aforementioned structure, and after planarization, an optical over coat layer 49 is formed, as shown in FIG. 15(*f*). A surface of the mesh structure 47 away from the transparent base material 10 may be flush with a surface of the optical over coat layer 49 away from the transparent base material 10.

(4-13) A substrate is peeled off, and a cutting treatment is performed.

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

In the present exemplary implementation, the thickness of the mesh structure is controlled by controlling the thickness of the second auxiliary patterning thin film, and the wire width of the mesh structure is controlled through an etching process on the hard mask.

Though the preparation method according to the present exemplary implementation, the second auxiliary patterning layer is converted into the groove of the first auxiliary patterning layer by utilizing a principle of pattern complementarity, and then a mesh structure is formed through an electroplating process. The preparation process according to the present embodiment may be achieved using an existing mature preparation device, and may be well compatible with an existing manufacturing process. The process is simple to achieve, easy to implement, high in efficiency of production, low in production cost, and high in yield.

Figure 16:
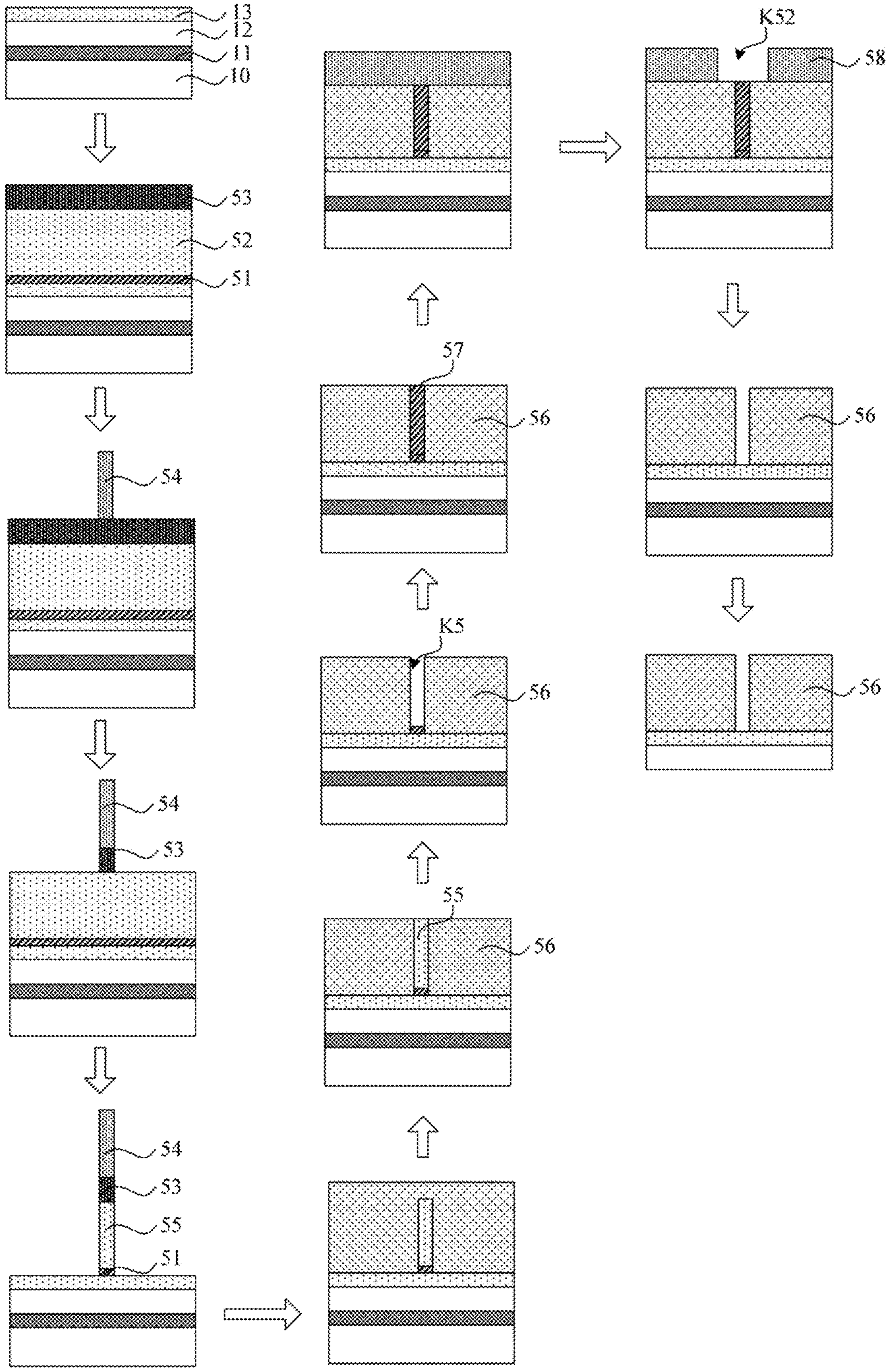
FIG. 16 is a schematic diagram of yet another antenna preparation flow according to at least one embodiment of the present disclosure.
Figure 17:
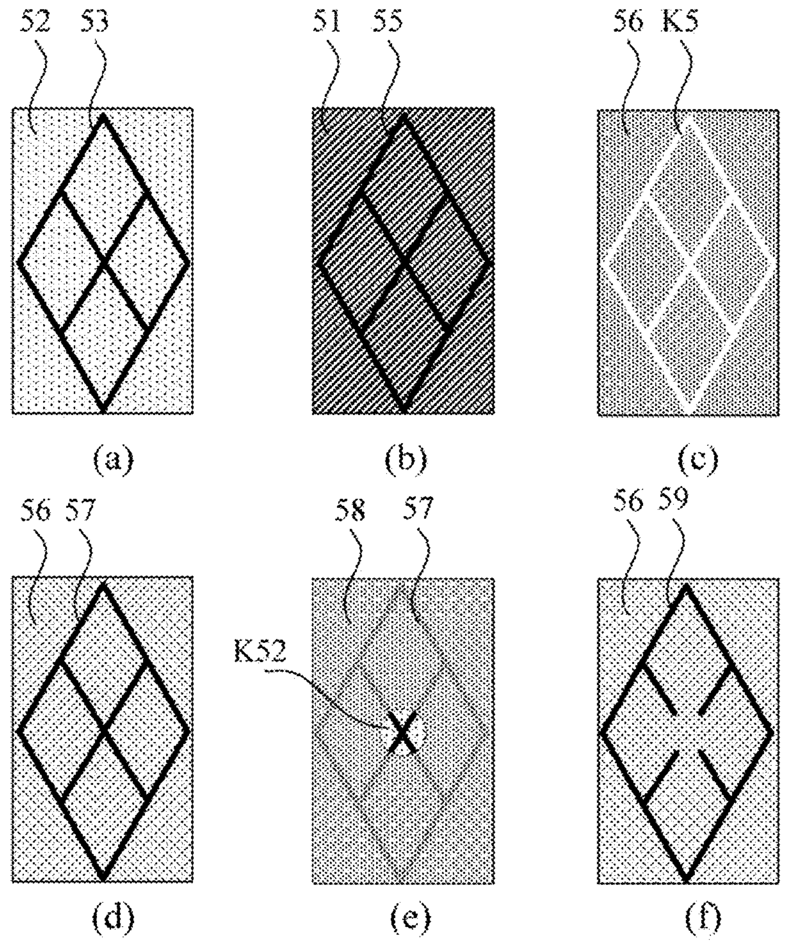
FIG. 17 is a partial plan schematic diagram of an antenna region in the antenna preparation flow shown in FIG. 16.

FIG. 16 is a schematic diagram of yet another antenna preparation flow according to at least one embodiment of the present disclosure. FIG. 17 is a partial plan schematic diagram of an antenna region in the antenna preparation flow shown in FIG. 16. Herein, FIG. 17 (*a*) is a partial plan schematic diagram after a hard mask is etched. FIG. 17 (*b*) is a partial plan schematic diagram after a second auxiliary patterning layer is formed. FIG. 17 (*c*) is a partial plan schematic diagram after a first auxiliary patterning layer is formed. FIG. 17 (*d*) is a partial plan schematic diagram after a conductive layer is formed. FIG. 17 (*e*) is a partial plan schematic diagram after a second photoresist layer is formed. FIG. 17 (*f*) is a partial plan schematic diagram after a mesh structure is formed.

In some exemplary implementations, as shown in FIG. 16 and FIG. 17, the antenna preparation flow of this embodiment may include the following steps.

(5-1) A transparent substrate 12 is prepared.

In some exemplary implementations, the OCA 11 is coated on the transparent base material 10 and then a COP thin film is attached to form a flexible transparent substrate 12. In some examples, the transparent base material 10 may be a hard base material such as glass or sapphire.

(5-2) A buffer layer 13 is formed on the transparent substrate 12.

In some exemplary implementations, the buffer layer 13 is formed on a surface of the transparent substrate 12 away from the transparent base material 10. In some examples, an inorganic material is deposited on the surface of the transparent substrate 12 away from the transparent base material 10 to form the buffer layer 13. For example, silicon dioxide ($SiO_2$) is deposited by a low temperature CVD process to form the buffer layer 13. In some examples, a thickness of the buffer layer 13 is about 10 nm to 100 nm.

(5-3) A seed layer 51 is formed on the buffer layer 13.

In some exemplary implementations, a metal thin film is deposited on a surface of the buffer layer 13 away from the transparent base material 10 to form a seed layer 51.

(5-4) A second auxiliary patterning thin film 52, a hard mask 53, and a patterned first photoresist layer 54 are sequentially formed on the seed layer 51.

(5-5) The hard mask 53 and the second auxiliary patterning thin film 52 are etched by using the first photoresist layer 54 to form the second auxiliary patterning layer 55, as shown in FIG. 17 (*a*) and FIG. 17 (*b*).

(5-6) The seed layer 51 is etched.

In some exemplary implementations, the seed layer 51 is etched by using a wet etching process to remove the seed layer 51 not covered by the second auxiliary patterning layer 55, i.e. to retain the seed layer 51 covered by the second auxiliary patterning layer 55.

(5-7) The first photoresist layer 54 and the hard mask 53 are removed.

(5-8) A first auxiliary patterning layer 56 is formed.

In some exemplary implementations, a photosensitive resin material (e.g. an optical adhesive) is coated on the transparent base material 10 formed with the aforementioned structure, and a planarization and ashing process are performed to form the first auxiliary patterning layer 56. A surface of the first auxiliary patterning layer 56 away from the transparent base material 10 may be flush with a surface of the second auxiliary patterning layer 55 away from the transparent base material 10. The first auxiliary patterning layer 56 of this example may serve as an optical over coat layer.

(5-9) The second auxiliary patterning layer 55 is removed.

In some exemplary implementations, the second auxiliary patterning layer 55 is etched by using a wet etching process, the second auxiliary patterning layer 55 is removed, and a fifth groove K5 is formed in the first auxiliary patterning layer 56, as shown in FIG. 17 (*c*). The fifth groove K5 exposes a surface of the seed layer 51. In this example, a shape and a dimension of the fifth groove K5 may be substantially the same as those of the second auxiliary patterning layer 55. In some examples, a width of the fifth groove K5 may be less than 1.5 um, and a height may be greater than 2 um.

(5-10) A conductive layer 57 is formed.

In some exemplary implementations, the conductive layer 57 is formed in the fifth groove K5 of the first auxiliary patterning layer 56 through an electroplating process, as shown in FIG. 15 (*d*). The conductive layer 57 of this example may be achieved through a wire electroplating process. The conductive layer 57 may have a mesh shape. The conductive layer 57 is in direct contact with a surface of the seed layer 51 in the fifth groove K5. A surface of the conductive layer 57 away from the transparent base material 10 may be flush with a surface of the first auxiliary patterning layer 56 away from the transparent base material 10.

(5-11) A second photoresist layer 58 is formed.

In some exemplary implementations, a photoresist is coated on the transparent base material 10 formed with the aforementioned structure, and a patterned second photoresist layer 58 is formed through a photolithography process of mask exposure and development, as shown in FIG. 10 (*e*). The second photoresist layer 58 has a first via hole K52 which exposes the conductive layer 57 at the intersecting position of the wires.

(5-12) The conductive layer 57 is etched.

In some exemplary implementations, the conductive layer 57 is etched by using a wet etching process to remove the conductive layer 57 at the intersecting position of the wires exposed by the second photoresist layer 58 to remove mesh intersecting points which need to be disconnected to form the mesh structure 59.

(5-13) The second photoresist layer 58 is removed, a substrate is peeled off, and a cutting treatment is performed.

In some exemplary implementations, the second photoresist layer 58 is removed by using a strip solution for photoresist cleaning, and performing deionized water cleaning and CDA air drying to expose the mesh structure 59 and the first auxiliary patterning layer 56, as shown in FIG. 17 (*f*).

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

In the present exemplary implementation, the disconnected intersecting points of the mesh structures are removed through a wet etching process after electroplating. In this example, the seed layer is etched first, and subsequently, the conductive layer is formed through a wire electroplating process. In this example, the thickness of the mesh structure is controlled by controlling the thickness of the second auxiliary patterning thin film, and the wire width of the mesh structure is controlled through an etching process on the hard mask.

Though the preparation method according to the present exemplary implementation, the second auxiliary patterning layer is converted into the groove of the first auxiliary patterning layer by utilizing a principle of pattern complementarity, then a conductive layer is formed through an electroplating process, and the conductive layer is etched to form a mesh structure. The preparation process according to the present embodiment may be achieved using an existing mature preparation device, and may be well compatible with an existing manufacturing process. The process is simple to achieve, easy to implement, high in efficiency of production, low in production cost, and high in yield.

For the detailed description of the relevant steps of the present exemplary implementation, reference may be made to the relevant description of the aforementioned embodiment, so details are not repeated here.

Figure 18:
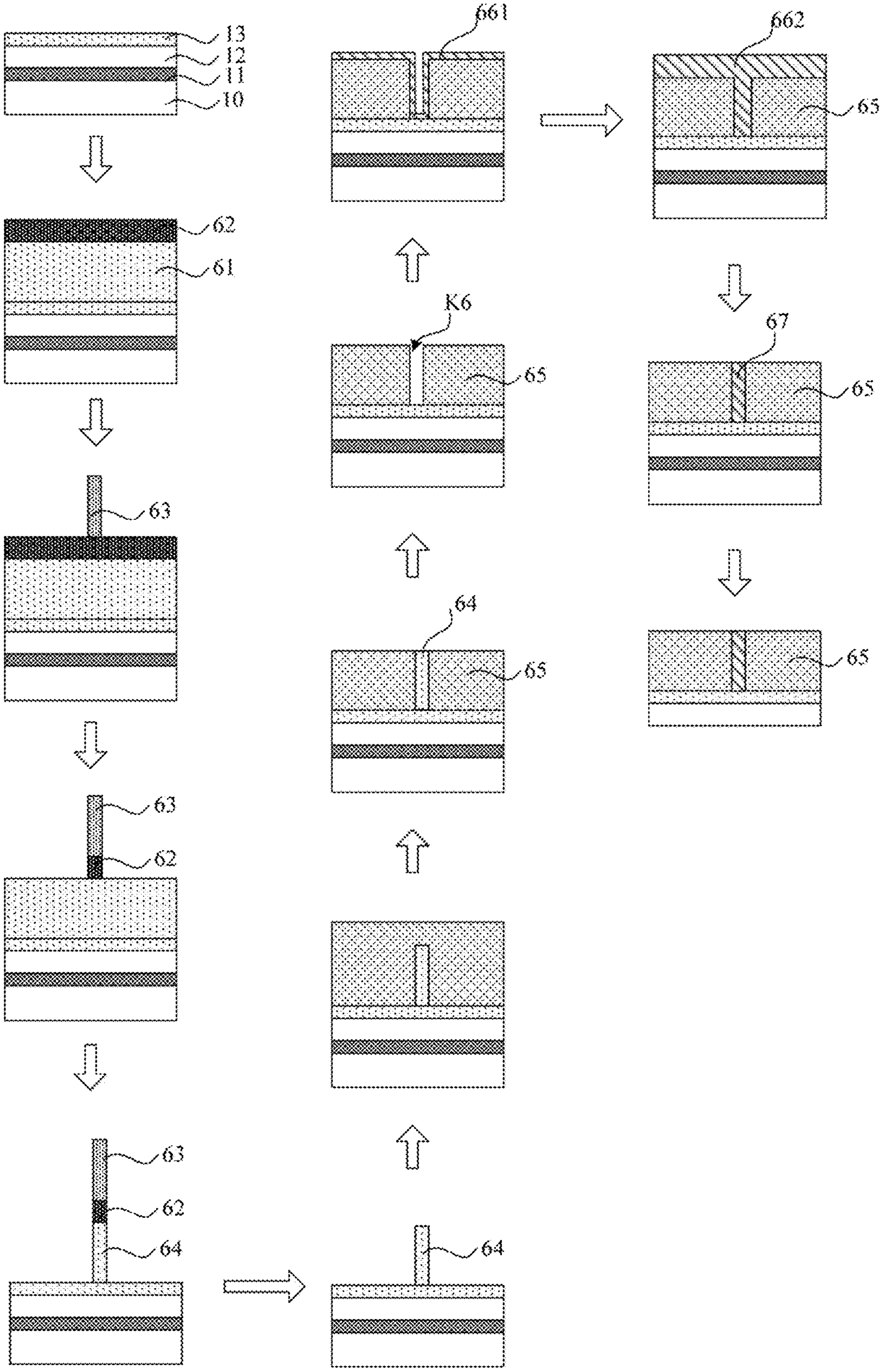
FIG. 18 is a schematic diagram of yet another antenna preparation flow according to at least one embodiment of the present disclosure.
Figure 19:
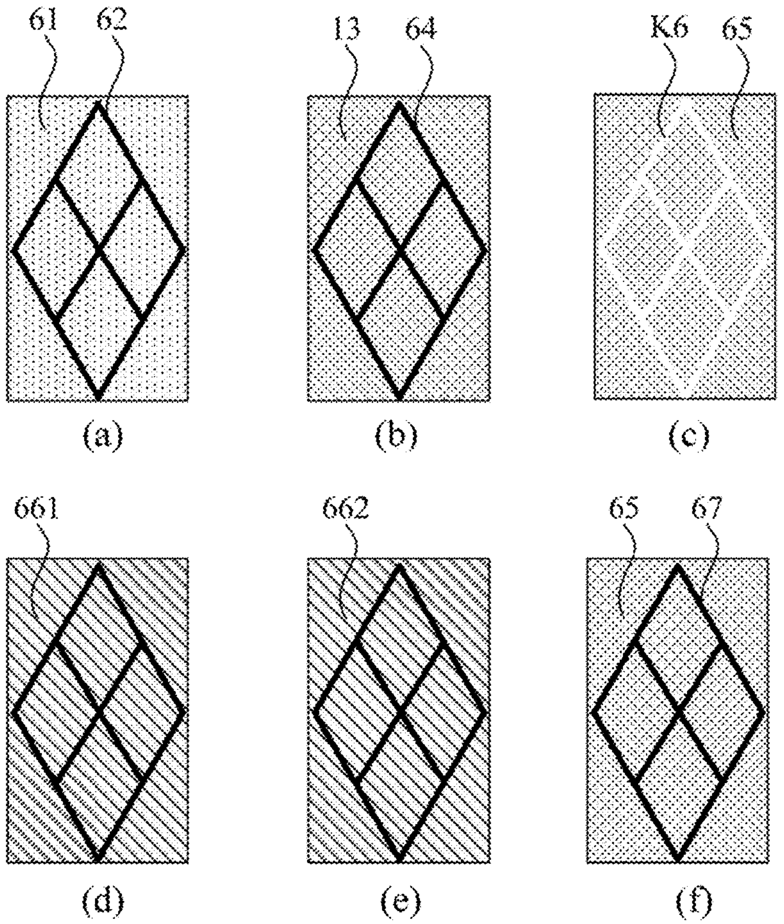
FIG. 19 is a partial plan schematic diagram of an antenna region in the antenna preparation flow shown in FIG. 18.

FIG. 18 is a schematic diagram of yet another antenna preparation flow according to at least one embodiment of the present disclosure. FIG. 19 is a partial plan schematic diagram of an antenna region in the antenna preparation flow shown in FIG. 18. Herein, FIG. 19 (*a*) is a partial plan schematic diagram after a hard mask is etched. FIG. 19 (*b*) is a partial plan schematic diagram after a second auxiliary patterning layer is formed. FIG. 19 (*c*) is a partial plan schematic diagram after a first auxiliary patterning layer is formed. FIG. 19 (*d*) is a partial plan schematic diagram after a seed layer is formed. FIG. 19 (*e*) is a partial plan schematic diagram after an electroplated layer is formed. FIG. 19 (*f*) is a partial plan schematic diagram after a mesh structure is formed.

In some exemplary implementations, as shown in FIG. 18 and FIG. 19, the antenna preparation flow of this embodiment may include the following steps.

(6-1) A transparent substrate 12 is prepared.

(6-2) A buffer layer 13 is formed on the transparent substrate 12.

(6-3) A second auxiliary patterning thin film 61, a hard mask 62, and a patterned first photoresist layer 63 are sequentially formed on the buffer layer 13.

(6-4) The hard mask 62 and the second auxiliary patterning thin film 61 are etched by using the first photoresist layer 63 to form the second auxiliary patterning layer 64.

(6-5) The first photoresist layer 63 and the hard mask 62 are removed.

(6-6) A first auxiliary patterning layer 65 is formed. In this example, the first auxiliary patterning layer 65 may serve as an optical over coat layer.

(6-7) The second auxiliary patterning layer 64 is removed.

(6-8) A mesh structure 67 is prepared.

In some exemplary implementations, a metal thin film is deposited on the transparent base material 10 formed with the aforementioned structure to form a seed layer 661 covering the entire transparent base material 10. Then, an electroplated layer 662 is formed on the seed layer 661 through a complete electroplating process. Then, the seed layer 661 and the electroplated layer 662 are etched through a wet etching process to remove the seed layer 661 and the electroplated layer 662 of a surface of the first auxiliary patterning layer 64 away from the transparent base material 10, retaining only the seed layer 661 and the electroplated layer 662 in the sixth groove K6 to form a mesh structure 67. However, this embodiment is not limited thereto. In other examples, taking that the material of the seed layer 661 and the electroplated layer 662 is Cu as an example, the seed layer 661 and the electroplated layer 662 may be thinned by using CMP to remove the seed layer 661 and the electroplated layer 662 of a surface of the first auxiliary patterning layer 65 away from the transparent base material 10.

In some examples, the electroplating process forming the electroplated layer 662 is a face electroplating process, which may first perform an entire surface pre-electroplating with a current density matching electroplating liquid by 10% to 30%, and then perform an entire surface electroplating with a current density matching the electroplating liquid.

(6-9) A substrate is peeled off, and a cutting treatment is performed.

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

In the exemplary implementation, the optical over coat layer is used as the first auxiliary patterning layer, the etching process of narrowing the metal wire width is unnecessary, the steps are simplified, and a uniformity of the wire width may be improved.

For the detailed description of the relevant steps of the present exemplary implementation, reference may be made to the relevant description of the aforementioned embodiment, so details are not repeated here.

Figure 20:
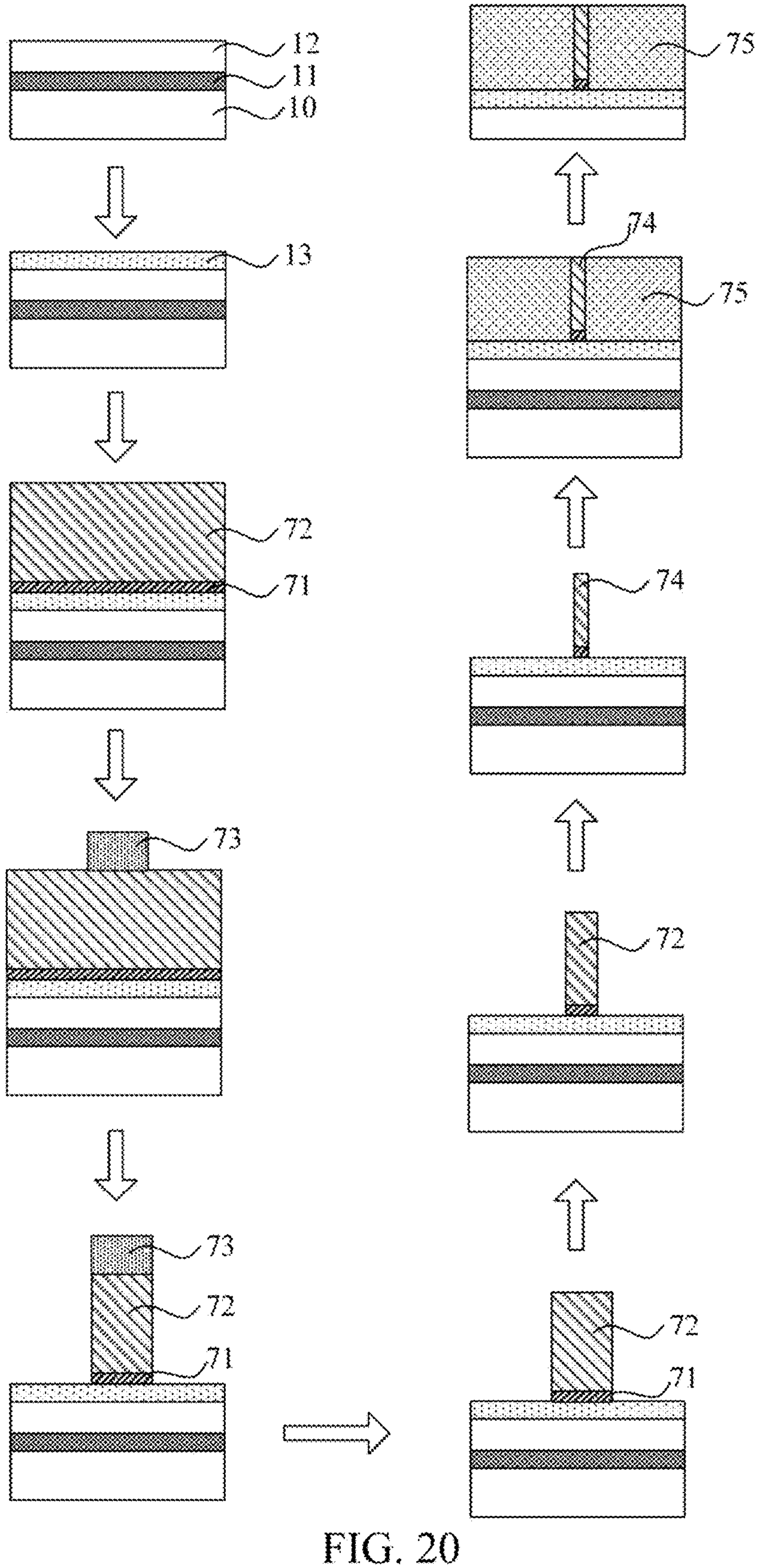
FIG. 20 is a schematic diagram of yet another antenna preparation flow according to at least one embodiment of the present disclosure.
Figure 21:
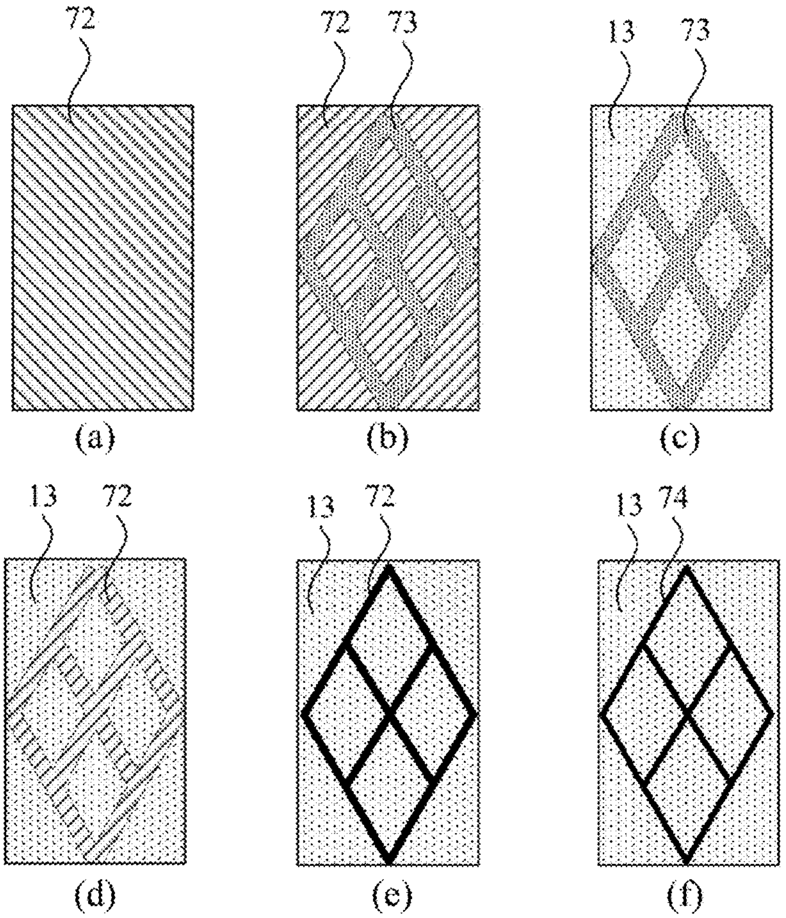
FIG. 21 is a partial plan schematic diagram of an antenna region in the antenna preparation flow shown in FIG. 20.

FIG. 20 is a schematic diagram of yet another antenna preparation flow according to at least one embodiment of the present disclosure. FIG. 21 is a partial plan schematic diagram of an antenna region in the antenna preparation flow shown in FIG. 20. FIG. 21 (*a*) is a partial plan schematic diagram after a conductive layer is formed. FIG. 21 (*b*) is a partial plan schematic diagram after a third photoresist layer is formed. FIG. 21 (*c*) is a partial plan schematic diagram after a conductive layer is etched by using a third photoresist layer. FIG. 21 (*d*) is a partial plan schematic diagram after a third photoresist layer is removed. FIG. 21 (*e*) is a partial plan schematic diagram of a conductive layer after a wire width for the first time. FIG. 21 (*e*) is a partial plan schematic diagram of a conductive layer after etching for narrowing the wire width for the second time.

In some exemplary implementations, as shown in FIG. 20 and FIG. 21, the antenna preparation flow of this embodiment may include the following steps.

(7-1) A transparent substrate 12 is prepared.

In some exemplary implementations, the flexible transparent substrate 12 is formed by coating an optical adhesive (such as OCA) 11 on a transparent base material 10 and then adhering a cyclic olefin polymer (COP) thin film. In some examples, the transparent base material 10 may be a hard base material such as glass or sapphire.

(7-2) A buffer layer 13 is formed on the transparent substrate 12.

In some exemplary implementations, the buffer layer 13 is formed on a surface of the transparent substrate 12 away from the transparent base material 10. In some examples, an inorganic material is deposited on the surface of the transparent substrate 12 away from the transparent base material 10 to form the buffer layer 13. For example, silicon dioxide ($SiO_2$) is deposited by a low temperature CVD process to form the buffer layer 13. In some examples, a thickness of the buffer layer 13 is about 10 nm to 100 nm.

(7-3) A conductive layer 72 is formed on the buffer layer 13.

In some exemplary implementations, an adhesive thin film is deposited on a surface of the buffer layer 13 away from the transparent base material 10 to form an adhesive layer 71; and subsequently a conductive layer 72 is formed on the adhesive layer 71 through a vacuum deposition (e.g. magnetron sputtering or evaporation) process or a vacuum deposition and entire surface electroplating process, as shown in FIG. 21 (*a*). The adhesion layer 71 is configured to increase an adhesion between the conductive layer 72 and the buffer layer 13. In some examples, a thickness of the conductive layer 72 is about 2 um to 3 um.

(7-4) A patterned third photoresist layer 73 is formed.

In some exemplary implementations, a photoresist is coated on a surface of the conductive layer 72 away from the transparent base material 10, and a patterned third photoresist layer 73 is formed through a photoresist process of mask exposure and development, as shown in FIG. 21 (*b*). In some examples, before coating a photoresist, an HMDS treatment may be performed on a surface of the conductive layer 72 to enhance an adhesion of the photoresist to the metal surface.

In some examples, a thickness of the third photoresist layer 73 is about 1 um to 3 um. The thickness of the third photoresist layer 73 is as thin as possible. A design wire width of the mesh pattern formed by the third photoresist layer 73 may be about 3 um to 5 um.

In some exemplary implementations, the photoresist may be selected as a low-temperature curing adhesive material, and the curing temperature is not higher than a tolerant temperature of the COP thin film and OCA, for example, the curing temperature may be about 140 C.

(7-5) The conductive layer 72 and the adhesive layer 71 are etched.

In some exemplary implementations, the conductive layer 72 and the adhesion layer 71 are etched by using a wet etching process to remove the conductive layer 72 and the adhesion layer 71 not covered by the third photoresist layer 73, i.e. to retain the conductive layer 72 and the adhesion layer 71 covered by the third photoresist layer 73, as shown in FIG. 21 (*c*), thereby forming a metal mesh having a wider wire width.

(7-6) The third photoresist layer 73 is removed.

In some exemplary implementations, the third photoresist layer 73 is removed by using a strip solution for photoresist cleaning, and performing deionized water cleaning and CDA air drying to expose the etched conductive layer 72 and the adhesion layer 71, as shown in FIG. 21 (d).

(7-7) Etching for narrowing wire widths for the first time on the conductive layer 72 and the adhesive layer 71 is performed.

In some exemplary implementations, the conductive layer 72 and the adhesive layer 71 are etched by using a wet etching process to narrow the wire width of the metal mesh, as shown in FIG. 21 (*e*).

In some examples, taking that materials of the conductive layer 72 and the adhesive layer 71 are Cu as an example, a hydrogen peroxide-based etching solution (e.g., the content of sulfuric acid ($H_2SO_4$) is about 2% to 4%, additive content is about 2% to 3%, and a concentration of hydrogen peroxide ($H_2O_2$) is about 0.1% to 1%) may be used for etching for a certain time until the wire width of the metal wire reaches a target wire width, e.g. 2.5 um.

(7-8) Etching for narrowing the wire widths for the second time on the conductive layer 72 and the adhesive layer 71 is performed.

In some exemplary implementations, the conductive layer 72 and the adhesive layer 71 are etched by using a wet etching process to further narrow the wire width of the metal mesh to form a mesh structure 74, as shown in FIG. 21 (*f*).

In some examples, taking that materials of the conductive layer 72 and the adhesive layer 71 are Cu as an example, a hydrogen peroxide-based etching solution (e.g., the content of sulfuric acid ($H_2SO_4$) is about 2% to 4%, additive content is about 2% to 3%, and a concentration of hydrogen peroxide ($H_2O_2$) is about 0.1% to 1%) may be used for etching for a certain time until the wire width of the metal wire reaches a target wire width, e.g. 1.5 um. In this step, the metal wire may be slowly etched with a lower hydrogen peroxide concentration, so as to achieve over-etching of the metal wire to achieve the target wire width.

(7-9) An optical over coat layer 75 is formed.

In some exemplary implementations, an optical adhesive is coated on the transparent base material 10 formed with the aforementioned structure, and after planarization, an optical over coat layer 75 is formed. A surface of the mesh structure 74 away from the transparent base material 10 may be flush with a surface of the optical over coat layer 75 away from the transparent base material 10.

In some examples, the optical adhesive may be SOC-5004U. A thickness of optical adhesive may be about 3 um to 4 um. A curing temperature of optical adhesive may not be higher than a tolerant temperature of COP thin film and OCA, for example, the curing temperature may be about 140 degrees Celsius. In other examples, the optical adhesive may be an adhesive material cured by ultraviolet.

(7-10) A substrate is peeled off, and a cutting treatment is performed.

In some exemplary implementations, the transparent base material formed with the aforementioned structure is cooled by using a low temperature (e.g. below −20° C.) cold plate, and then the flexible substrate 12 is peeled off from the transparent base material 10 to obtain an antenna substrate. Then, the antenna substrate is cut by using a cutting device, for example, along a cutting line of the invalid region, so as to cut off the invalid region and the energized region to obtain a transparent antenna.

The preparation method of the present exemplary implementation achieves a mesh structure meeting a wire width condition through a single lithography process and a plurality of wet etching processes. The preparation method according to the present exemplary implementation adopts only one lithography process, and the preparation process is simple. Moreover, a preparation process at a low temperature (e.g. 140° C.) is supported, and the flexible transparent substrate is not easily damaged. The preparation process according to the present embodiment may be achieved using an existing mature preparation device, and may be well compatible with an existing manufacturing process. The process is simple to achieve, easy to implement, high in efficiency of production, low in production cost, and high in yield.

At least one embodiment of the present disclosure further provides a sensing device prepared by the method described above. In some examples, the sensing device prepared in the above manner at least includes a transparent substrate, and a mesh structure arranged on the transparent substrate. In some examples, the above sensing device may be a transparent antenna. However, this embodiment is not limited thereto.

In some exemplary implementations, taking the above sensing device being a transparent antenna as an example, the transparent antenna may include an antenna region and a visual compensation region in a plane parallel to the transparent antenna. The antenna region and the visual compensation region are provided with mesh structures. In a plane perpendicular to the transparent antenna, the transparent antenna may include a transparent substrate, a buffer layer, a mesh structure, and an optical over coat layer which are sequentially arranged on the transparent substrate. The mesh structure of the antenna region may be configured to transmit and receive microwave signals. The mesh structure of the visual compensation region is configured to reduce a visual perception difference between the antenna region and the visual compensation region. However, this embodiment is not limited thereto.

At least one embodiment of the present disclosure further provides an electronic device including the sensing device (e.g. a transparent antenna) as described above. In some exemplary implementations, the electronic device may be any product or component with communication and display functions such as a smart phone, a navigation device, a game machine, a television (TV), a car audio, a tablet computer, a Personal Multimedia Player (PMP), a Personal Digital Assistant (PDA), etc. However, this embodiment is not limited thereto.

Figure 22:
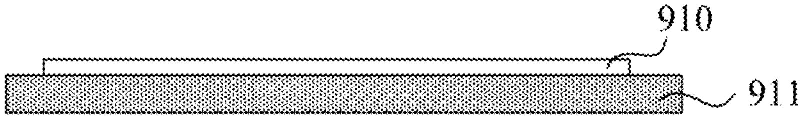
FIG. 22 is a schematic diagram of an electronic device according to at least one embodiment of the present disclosure.

FIG. 22 is a schematic diagram of an electronic device according to at least one embodiment of the present disclosure. In some exemplary implementations, as shown in FIG. 22, the electronic device of the present embodiment includes a display panel 911 and a transparent antenna 910. The transparent antenna 910 may be located on a light emitting side of the display panel 911. An orthographic projection of the transparent antenna 910 on the display panel 911 is overlapped with a display region of the display panel 911. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict.

Those of ordinary skills in the art should understand that modifications or equivalent replacements may be made to the technical solutions of the present disclosure without departing from the essence and scope of the technical solutions of the present disclosure, and shall all fall within the scope of the claims of the present disclosure.

The invention claimed is:

1. A preparation method for a sensing device, comprising:
- forming a first auxiliary patterning layer having a groove on a surface of a transparent substrate; and
- forming a mesh structure in the groove of the first auxiliary patterning layer through an electroplating process; or forming a conductive layer in the groove of the first auxiliary patterning layer through an electroplating process, and etching the conductive layer to form the mesh structure,
- wherein a wire width of the mesh structure is less than or equal to 1.5 microns, and a thickness of the mesh structure is greater than or equal to 2 microns,
- wherein before forming the first auxiliary patterning layer having the groove on the surface of the transparent substrate, the method further comprises:
- sequentially forming a second auxiliary patterning thin film, a hard mask, and a patterned first photoresist layer on the surface of the transparent substrate; etching the second auxiliary patterning thin film and the hard mask by using the patterned first photoresist layer to form a patterned second auxiliary patterning layer; and
- wherein forming the first auxiliary patterning layer having the groove on the surface of the transparent substrate comprises: forming the first auxiliary patterning layer on a surface of the second auxiliary patterning layer away from the transparent substrate, wherein a surface of the first auxiliary patterning layer away from the transparent substrate is flush with the surface of the second auxiliary patterning layer away from the transparent substrate; and removing the second auxiliary patterning layer to form the groove of the first auxiliary patterning layer, wherein a width of the groove is substantially the same as the wire width of the mesh structure.

2. The method according to claim 1, wherein etching of the conductive layer comprises: etching the conductive layer through a wet etching process.

3. The method according to claim 1, wherein forming the first auxiliary patterning layer having the groove on the surface of the transparent substrate comprises:

coating a photoresist material on the surface of the transparent substrate, exposing and developing the photoresist material to form the first auxiliary patterning layer having the groove, wherein a width of the groove is larger than a wire width of the mesh structure; and wherein after forming the conductive layer and before etching the conductive layer, the method further comprises removing the first auxiliary patterning layer.

4. The method according to claim 3, wherein before forming the first auxiliary patterning layer having the groove on the surface of the transparent substrate, the method further comprises forming a seed layer on the surface of the transparent substrate through a deposition process; after the first auxiliary patterning layer is formed, the groove of the first auxiliary patterning layer exposes a surface of the seed layer; and wherein after removing the first auxiliary patterning layer and before etching the conductive layer, the method further comprises etching the seed layer to remove the seed layer not covered by the conductive layer.

5. The method according to claim 4, wherein: before forming the seed layer on the surface of the transparent substrate through the deposition process, the method further comprises: forming an adhesive layer on the surface of the transparent substrate through a deposition process; and wherein after etching the conductive layer, the method further comprises: etching the adhesive layer and retaining the adhesive layer covered by the etched conductive layer.

6. The method according to claim 3, wherein after forming the first auxiliary patterning layer having the groove on the surface of the transparent substrate, and before forming the conductive layer in the groove of the first auxiliary patterning layer through an electroplating process, the method further comprises: forming a seed layer in the groove of the first auxiliary patterning layer and on the surface of the first auxiliary patterning layer away from the transparent substrate through a deposition process.

7. The method according to claim 6, wherein forming the conductive layer in the groove of the first auxiliary patterning layer through the electroplating process comprises:

forming a first electroplated layer and a second electroplated layer in the groove of the first auxiliary patterning layer and on the surface of the first auxiliary patterning layer away from the transparent substrate through the electroplating process; and removing the second electroplated layer, the first electroplated layer, and the seed layer on the surface of the first auxiliary patterning layer away from the transparent substrate, and forming the conductive layer in the groove of the first auxiliary patterning layer.

8. The method according to claim 6, wherein forming the conductive layer in the groove of the first auxiliary patterning layer through the electroplating process comprises:

forming a first electroplated layer in the groove of the first auxiliary pattern layer and on the surface of the first auxiliary pattern layer away from the transparent substrate through the electroplating process;

removing the seed layer and the first electroplated layer on the surface of the first auxiliary patterning layer away from the transparent substrate, and retaining the seed layer and the first electroplated layer in the groove; and forming a second electroplated layer in the groove of the first auxiliary patterning layer through the electroplating process.

9. The method according to claim 1, wherein: the first auxiliary patterning layer is made of a photoresist material;

before forming the second auxiliary patterning thin film on the surface of the transparent substrate, the method further comprises: forming a seed layer on the surface of the transparent substrate; and after forming the mesh structure in the groove of the first auxiliary patterning layer through the electroplating process, the method further comprises: removing the first auxiliary patterning layer, etching the seed layer, and removing the seed layer not covered by the mesh structure.

10. The method according to claim 1, wherein: the first auxiliary patterning layer is made of a photosensitive resin material;

before forming the second auxiliary patterning thin film on the surface of the transparent substrate, the method further comprises forming a seed layer on the surface of the transparent substrate; and after etching the second auxiliary patterning thin film and the hard mask by using the patterned first photoresist layer to form the patterned second auxiliary patterning layer, the method further includes etching the seed layer to remove the seed layer not covered by the second auxiliary patterning layer.

11. The method according to claim 8, wherein etching the conductive layer to form the mesh structure comprises:

forming a patterned second photoresist layer on surfaces of the first auxiliary patterning layer and the conductive layer away from the transparent substrate, wherein the second photoresist layer exposes the conductive layer at a target position; and removing the conductive layer at the target position through an etching process to form the mesh structure.

12. The method according to claim 1, wherein: the first auxiliary patterning layer is made of a photosensitive resin material;

after forming the first auxiliary patterning layer having the groove on the surface of the transparent substrate, and before forming the mesh structure in the groove of the first auxiliary patterning layer through the electroplating process, the method further comprises forming a seed layer in the groove of the first auxiliary patterning layer and on the surface of the first auxiliary patterning layer away from the transparent substrate through a deposition process; and forming the mesh structure in the groove of the first auxiliary patterning layer through the electroplating process comprises: forming a first electroplated layer and a second electroplated layer in the groove of the first auxiliary patterning layer and on the surface of the first auxiliary patterning layer away from the transparent substrate through the electroplating process; and removing the second electroplated layer, the first electroplated layer, and the seed layer on the surface of the first auxiliary patterning layer away from the transparent substrate to form an antenna structure in the groove of the first auxiliary patterning layer.

13. The method according to claim 1, wherein: the transparent substrate comprises a valid region, an invalid region surrounding the valid region; and the mesh structure is located in the valid region, and the invalid region is provided with an invalid mesh; and a wire width of the invalid mesh is greater than or equal to a wire width of the mesh structure of the valid region.

14. The method according to claim 13, wherein the transparent substrate further comprises an energized region surrounding the invalid region, and the energized region is configured to provide an electroplating current in the electroplating process.

15. The method according to claim 13, wherein the valid region comprises: an antenna region and a visual compensation region located on at least one side of the antenna region; and a pattern of the mesh structure of the antenna region is different from a pattern of the mesh structure of the visual compensation region.

16. The method according to claim 13, wherein a wire width of the invalid mesh is increased gradually and continuously, or step by step, along a direction away from the valid region.

17. The method according to claim 1, wherein a thickness of the mesh structure is about 2 microns to 5 microns.

* * * * *